(12) United States Patent
Choi et al.

(10) Patent No.: US 10,777,487 B2
(45) Date of Patent: Sep. 15, 2020

(54) INTEGRATED CIRCUIT DEVICE INCLUDING THROUGH-SILICON VIA STRUCTURE AND METHOD OF MANUFACTURING THE SAME

(71) Applicant: Samsung Electronics Co., Ltd., Suwon-si, Gyeonggi-do (KR)

(72) Inventors: Ju-il Choi, Seongnam-si (KR); Kun-sang Park, Hwaseong-si (KR); Son-kwan Hwang, Suwon-si (KR); Ji-soon Park, Suwon-si (KR); Byung-lyul Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 57 days.

(21) Appl. No.: 16/131,182

(22) Filed: Sep. 14, 2018

(65) Prior Publication Data

US 2019/0013260 A1    Jan. 10, 2019

Related U.S. Application Data

(62) Division of application No. 14/543,688, filed on Nov. 17, 2014, now Pat. No. 10,128,168.

(30) Foreign Application Priority Data

Nov. 18, 2013 (KR) .................. 10-2013-0140092

(51) Int. Cl.
*H01L 23/48* (2006.01)
*H01L 23/31* (2006.01)
(Continued)

(52) U.S. Cl.
CPC ...... *H01L 23/481* (2013.01); *H01L 21/76831* (2013.01); *H01L 21/76898* (2013.01);
(Continued)

(58) Field of Classification Search
None
See application file for complete search history.

(56) References Cited

U.S. PATENT DOCUMENTS

| 6,093,635 A | 7/2000 | Tran et al. |
| 2004/0152168 A1* | 8/2004 | German ............... A61K 48/005 435/69.4 |

(Continued)

FOREIGN PATENT DOCUMENTS

| JP | H10-233444 A | 9/1998 |
| JP | 2000-277611 A | 10/2000 |

(Continued)

OTHER PUBLICATIONS

Korean Office Action dated Jan. 16, 2020 for KR Application No. 10-2013-0140092.

*Primary Examiner* — Alexander G Ghyka
(74) *Attorney, Agent, or Firm* — Harness, Dickey & Pierce, P.L.C.

(57) ABSTRACT

An integrated circuit (IC) device includes a semiconductor substrate having a via hole extending through at least a part thereof, a conductive structure in the via hole, a conductive barrier layer adjacent the conductive structure; and a via insulating layer interposed between the semiconductor substrate and the conductive barrier layer. The conductive barrier layer may include an outer portion oxidized between the conductive barrier layer and the via insulating layer, and the oxidized outer portion of the conductive barrier layer may substantially surrounds the remaining portion of the conductive barrier layer.

20 Claims, 23 Drawing Sheets

(51) Int. Cl.
*H01L 21/768* (2006.01)
*H01L 23/532* (2006.01)
*H01L 25/065* (2006.01)

(52) U.S. Cl.
CPC ...... *H01L 23/3128* (2013.01); *H01L 25/0657* (2013.01); *H01L 23/53238* (2013.01); *H01L 23/53266* (2013.01); *H01L 2224/16145* (2013.01); *H01L 2224/16225* (2013.01); *H01L 2924/13091* (2013.01); *H01L 2924/15311* (2013.01)

(56) References Cited

U.S. PATENT DOCUMENTS

| | | |
|---|---|---|
| 2007/0077755 A1 | 4/2007 | Hong |
| 2008/0254619 A1 | 10/2008 | Lin et al. |
| 2008/0299762 A1 | 12/2008 | Mathew et al. |
| 2009/0298279 A1 | 12/2009 | Feustel et al. |
| 2011/0006428 A1 | 1/2011 | Lo et al. |
| 2011/0097902 A1 | 4/2011 | Singh et al. |
| 2011/0241205 A1 | 10/2011 | Kirby et al. |
| 2012/0152168 A1* | 6/2012 | Sakata ............... C23C 16/045 118/719 |
| 2013/0119528 A1* | 5/2013 | Groothuis ............ H01L 23/36 257/690 |

FOREIGN PATENT DOCUMENTS

| | | |
|---|---|---|
| JP | 2009-170665 A | 7/2009 |
| KR | 2005-0092861 A | 9/2005 |
| KR | 2005-0096636 A | 10/2005 |
| KR | 10-0613391 B1 | 8/2006 |
| KR | 10-0708529 B1 | 4/2007 |
| KR | 10-1147529 B1 | 5/2012 |
| KR | 2012-0054994 A | 5/2012 |

* cited by examiner

INTEGRATED CIRCUIT DEVICE INCLUDING THROUGH-SILICON VIA STRUCTURE AND METHOD OF MANUFACTURING THE SAME

CROSS-REFERENCE TO RELATED APPLICATIONS

This application is a divisional of U.S. patent application Ser. No. 14/543,668 filed on Nov. 17, 2014, which claims the benefit of Korean Patent Application No. 10-2013-0140092, filed on Nov. 18, 2013, in the Korean Intellectual Property Office, the disclosure of each of which is incorporated herein in its entirety by reference.

BACKGROUND

The inventive concepts relate to an integrated circuit (IC) device and a method of manufacturing the same, and more particularly, to an IC device including a through-silicon via (TSV) structure and a method of manufacturing the same.

In three-dimensional (3D) package technology, a TSV has been developed to provide a vertical electrical connection passing through a substrate or a die. In order to improve the performance and reliability of a 3D package, a stable TSV structure may be needed.

SUMMARY

In some embodiments, a device comprises a semiconductor substrate having a via hole extending through at least a part thereof: a conductive structure in the via hole; a conductive barrier layer adjacent the conductive structure; and a via insulating layer interposed between the semiconductor substrate and the conductive barrier layer. The conductive barrier layer may include an outer portion oxidized between the conductive barrier layer and the via insulating layer, and the oxidized outer portion of the conductive barrier layer may substantially surround the remaining portion of the conductive barrier layer.

In some embodiments, a device comprises: a semiconductor substrate having a via hole extending through at least a part thereof; and a through-silicon via (TSV) formed in the via hole, the TSV including: a conductive structure extending through the via hole; a barrier layer substantially surrounding the conductive structure, the barrier layer having a first layer formed of a metal component and a second layer formed of a nitride of the metal component, the barrier layer having an oxide layer of the metal component disposed between the first layer and the second layer; and a via insulating layer interposed between the semiconductor substrate and the barrier layer.

In some embodiments, a device comprising: a semiconductor substrate having a via hole extending through at least a part thereof; and a through-silicon via (TSV) including: a conductive structure formed in the via hole; a conductive barrier layer substantially surrounding the conductive structure, the conductive barrier layer having a metal component; a metal-containing insulating layer substantially surrounding the conductive barrier layer, the metal-containing insulating layer having the metal component; and a via insulating layer interposed between the semiconductor substrate and the metal-containing insulating layer.

In some embodiments, the metal-containing insulating layer may be formed by oxidation of the metal component contained in the conductive barrier layer. method of forming a semiconductor device including a through-silicon via (TSV), the method comprising: forming a via hole that extends through at least a part of a semiconductor substrate; forming a via insulating layer that covers an inner wall of the via hole; degassing the via insulating layer at a temperature range of between approximately 300° C. and approximately 500° C.; forming a conductive barrier layer on the via insulating layer within the via hole, where the degassing of the via insulating layer and the forming of the conductive barrier layer may be performed in situ and in a vacuum atmosphere; and filling the via hole with a conductive structure.

In some embodiments, a method comprising: forming an opening that extends through at least a part of a semiconductor substrate, wherein the opening has an aspect ratio between about 5 to about 20; forming an insulating layer that covers an inner wall of the opening; degassing the insulating layer at a temperature range of between approximately 300° C. and approximately 500° C.; forming a conductive barrier layer on the insulating layer within the opening, where the degassing of the insulating layer and the forming of the conductive barrier layer are performed in situ and in a vacuum atmosphere; and filling the opening with a conductive structure; and heat treating the resulting structure such that an outer portion of the conductive barrier is oxidized, where the degassing is performed at the temperature range that allows the oxidized outer portion of the conductive barrier layer to substantially surround a remaining portion of the conductive barrier layer during the heat treating.

In some embodiments, an assembly method comprising: forming a via hole that extends through at least a part of a semiconductor substrate having a transistor; forming a via insulating layer that covers an inner wall of the via hole; degassing the via insulating layer at a temperature range of between approximately 300° C. and approximately 500° C.; forming a conductive barrier layer on the via insulating layer within the via hole, where the degassing of the via insulating layer and the forming of the conductive barrier layer are performed in situ and in a vacuum atmosphere; and filling the via hole with a conductive structure, thereby forming a TSV; heat treating the resulting structure such that an outer portion of the conductive barrier is oxidized, wherein the degassing is performed at the temperature range that allows the oxidized outer portion of the conductive barrier layer to substantially surround a remaining portion of the conductive barrier layer during the heat treating; and stacking the semiconductor substrate with another semiconductor substrate having another TSV formed therethrough, where the TSV is electrically coupled to another TSV.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
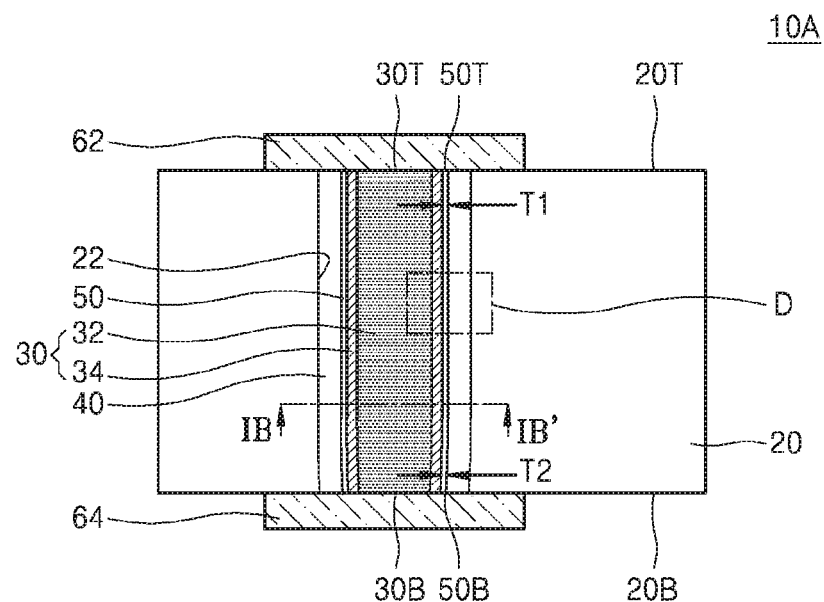
FIG. 1A is a cross-sectional view illustrating an integrated circuit (IC) device according to an embodiment of the inventive concept.

The inventive concept will now be described more fully with reference to the accompanying drawings, in which exemplary embodiments of the inventive concept are shown. The same elements in the drawings are denoted by the same reference numerals and a repeated explanation thereof will not be given.

The inventive concepts now will be described more fully hereinafter with reference to the accompanying drawings, in which elements of the inventive concept are shown. The inventive concepts may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element may be named a second element and similarly a second element may be named a first element without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In other embodiments, a specific order of processes may be changed. For example, two processes consecutively described herein may be simultaneously performed or may be performed in an order opposite to that described.

Variations from the shapes of the illustrations as a result, for example, of manufacturing techniques and/or tolerances, are to be expected. Thus, exemplary embodiments should not be construed as limited to the particular shapes of regions illustrated herein but may be construed to include deviations in shapes that result, for example, from manufacturing.

Figure 1B:
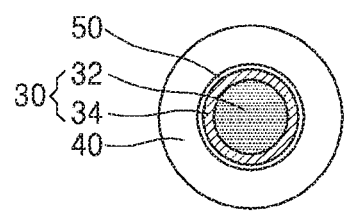
FIG. 1B is a cross-sectional view taken along line IB-IB' of FIG. 1A.

FIG. 1A is a sectional view illustrating an integrated circuit (IC) device 10A according to an embodiment of the inventive concept. FIG. 1B is a cross-sectional view taken along a line IB-IB' of FIG. 1A.

Referring to FIGS. 1A and 1B, the IC device 10A includes a semiconductor structure 20 and a through-wafer via (TWV) such as a through-silicon via (TSV) structure 30 that passes through the semiconductor structure 20 through a via hole 22 formed in the semiconductor structure 20. It will be appreciated and understood that, in disclosing embodiments herein of the inventive concept, the narrower term TSV may be used instead of the intentionally broader term TWV, the wafer (W) part of which of course refers to a wafer made of any suitable wafer material whether silicon or otherwise. An aspect ratio of the via hole may be between about 5 and about 20.

A via insulating layer 40 may be interposed between the semiconductor structure 20 and the TSV structure 30.

The TSV structure 30 includes a conductive structure or a conductive plug 32 that passes through the semiconductor structure 20 and a conductive barrier layer 34 that substantially surrounds (or adjacent to) the conductive plug 32. The conductive barrier layer 34 may include a conductive element such as a metal component, e.g., tantalum (Ta), titanium (Ti), or a combination thereof.

A metal-containing insulating layer 50 may be interposed between the conductive barrier layer 34 and the via insulating layer 40. In some embodiments, the metal-containing insulating layer 50 may be formed of a metal oxide layer, a metal oxynitride layer, or a combination of the metal oxide layer and the metal oxynitride layer. The metal-containing insulating layer 50 may include a metal component, e.g., tantalum (Ta), titanium (Ti), or a combination thereof, which may be the same as the metal component of the conductive barrier layer 34. For example, the metal-containing insulating layer 50 may be formed of a Ta oxide layer, a Ta oxynitride layer, a Ti oxide layer, a Ti oxynitride layer, or a combination thereof.

After the TSV structure 30 including the conductive barrier layer 34 and the conductive plug 32 is formed, a part of the conductive barrier layer 34 may be oxidized (for example, at an interface) between the conductive barrier layer 34 and the via insulating layer 40 so that the metal-containing insulating layer 50 may be formed. (One can say that the conductive barrier layer 34 includes a metal-containing insulating layer 50.) Therefore, when the conductive barrier layer 34 is formed of a metal, the metal-containing insulating layer 50 may be formed of the metal oxide layer and, when the conductive barrier layer 34 has a lamination structure of a metal nitride layer and a metal layer, the metal-containing insulating layer 50 may be formed of the metal oxynitride layer.

Figure 1C:
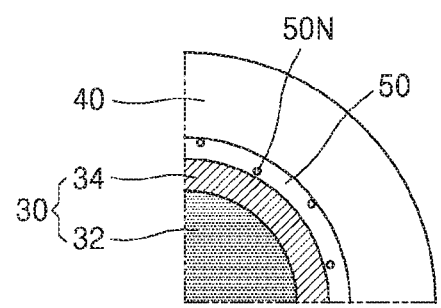
FIG. 1C is a partial cross-sectional view illustrating elements of a metal-containing insulating layer included in the IC device of FIG. 1A.

FIG. 1C is an enlarged partial cross-sectional view illustrating a part of FIG. 1B, in which an example in which the metal-containing insulating layer 50 is formed of the metal oxynitride layer is illustrated.

As illustrated in FIG. 1C, the metal-containing insulating layer 50 formed of the metal oxynitride layer may be in the form of a metal oxide layer in which nitrogen atoms 50N are dispersed at a low density. In order to form the metal-containing insulating layer 50 in the form of the metal oxide layer in which the nitrogen atoms 50N are dispersed at the low density, when the conductive barrier layer 34 is formed, the metal nitride layer having a very small thickness and the metal layer having a larger thickness than that of the metal nitride layer may be sequentially formed. The nitrogen atoms 50N in the metal-containing insulating layer 50 may be diffused from the metal nitride layer that is a part of the conductive barrier layer 34.

The conductive barrier layer 34 may include at least one material selected from W, tungsten nitride (WN), tungsten carbide (WC), Ti, titanium nitride (TiN), Ta, TaN, ruthenium (Ru), cobalt (Co), manganese (Mn), Ni, or NiB.

For example, to form the conductive barrier layer 34, a lamination structure of a tantalum nitride (TaN) layer having a thickness of about 50 angstroms (Å) to about 200 Å and a Ta layer having a thickness of about 1,000 to about 3,000 Å may be formed based on the thickness deposited on a top surface of a semiconductor structure 20 during deposition. As a result, in the via hole 22, a TaN layer having a thickness of about 10 Å or less, which is smaller than that on the top surface of the semiconductor structure 20 outside the via hole 22, and a Ta layer having a thickness of about 10 Å to about 500 Å (more preferably about 10 Å to about 100 Å) may be formed. In some embodiments, the Ta layer may be formed to have a smaller thickness, for example, a thickness of about 5 Å to about 100 Å. The thicknesses of the TaN layer and the Ta layer that form the TSV structure 30 may vary in accordance with a height of the TSV structure 30, that is, a length of the via hole 22. For example, the Ta/TaN layer may have a thickness of about 40 Å to about 120 Å.

A thickness of the metal-containing insulating layer 50 may be smaller than that of the conductive barrier layer 34. In some embodiments, in the via hole 22, the metal-containing insulating layer 50 may have a thickness not more than 50 angstroms. For example, the metal-containing insulating layer 50 may have a thickness of about 2 Å to about 50 Å and the conductive barrier layer 34 may have a thickness of about 10 Å to about 500 Å.

The metal-containing insulating layer 50 has a first end 50T and a second end 50B that form both ends along a longitudinal direction of the TSV structure 30. Here, the longitudinal direction of the TSV structure 30 means the shortest longitudinal direction from a first surface 20T of the semiconductor structure 20 to a second surface 20B opposite to the first surface 20T. In the present specification, a longitudinal direction of the via hole 22 may have the same meaning as that of the longitudinal direction of the TSV structure 30.

In FIG. 1A, it is illustrated that the first end 50T and the second end 50B are positioned on substantially the same level as that of a top surface 30T and a bottom surface 30B of the TSV structure 30, respectively. However, the inventive concepts are not limited thereto. The first end 50T and the second end 50B may be positioned on a different level from that of the top surface 30T and the bottom surface 30B of the TSV structure 30. In some embodiments, the first end 50T and the second end 50B of the metal-containing insulating layer 50 may have different thicknesses. For example, a thickness T1 of the first end 50T of the metal-containing insulating layer 50 may be different from a thickness T2 of the second end 50B. However, the inventive concepts are not limited thereto.

The metal-containing insulating layer 50 may substantially surround the TSV structure 30 as illustrated in FIG. 1B in plan view. The metal-containing insulating layer 50 may have a ring shape in plan view. The metal-containing insulating layer may have a substantially uniform thickness in plan view. However, the inventive concept is not limited thereto. In some embodiments, the metal-containing insulating layer 50 may be continuously extended from the first end 50T to the second end 50B. In some embodiments, the metal-containing insulating layer 50 may be intermittently extended from the first end 50T to the second end 50B.

The conductive barrier layer 34 of the TSV structure 30 may be cylinder-shaped to surround the conductive plug 32 between the conductive plug 32 and the metal-containing insulating layer 50.

The metal-containing insulating layer 50 may be formed by oxidation of the metal component contained in the conductive barrier layer 34. The conductive barrier layer 34 and the metal-containing insulating layer 50 may therefore include the same metal. For example, the conductive barrier layer 34 may include Ta and the metal-containing insulating layer 50 may include a Ta oxide layer or a Ta oxynitride.

In some embodiments, the conductive plug 32 of the TSV structure 30 may include Cu or W. For example, the conductive plug 32 may be formed of copper (Cu), copper tin (CuSn), copper magnesium (CuMg), copper nickel (CuNi), copper zinc (CuZn), copper palladium (CuPd), copper gold (CuAu), copper rhenium (CuRe), copper tungsten (CuW), tungsten (W), or a W alloy. However, the inventive concept is not limited thereto.

In some embodiments, the conductive barrier layer 34 and the conductive plug 32 may be formed by a physical vapour deposition (PVD) process or a chemical vapor deposition (CVD) process. However, the inventive concept is not limited thereto.

The via insulating layer 40 may be formed of an oxide layer, a nitride layer, a carbide layer, polymer, or a combination thereof. In some embodiments, the CVD process may be used for forming the via insulating layer 40. The via insulating layer 40 may be formed to have a thickness (show in the drawing) of about 1,000 Å to about 2,000 Å. For example, the via insulating layer 40 may be formed of an ozone/tetra-ethyl ortho-silicate ($O_3$/TEOS)-based high-aspect ratio process (HARP) oxide layer formed by a sub-atmospheric CVD process.

A first conductive layer 62 that contacts the top surface 30T of the TSV structure 30 is formed on the first surface 20T of the semiconductor structure 20. A second conductive layer 64 that contacts the bottom surface 30B of the TSV structure 30 is formed on the second surface 20B of the semiconductor structure 20. The first conductive layer 62 and the second conductive layer 64 may be formed of metals, respectively.

In some embodiments, the semiconductor structure 20 may be formed of a semiconductor substrate, for example, a silicon substrate. The TSV structure 30 may have a sidewall surrounded by the semiconductor substrate.

In other embodiments, the semiconductor structure 20 may include a semiconductor substrate and an interlayer insulating layer that covers the semiconductor substrate. The TSV structure 30 may pass through the semiconductor substrate and the interlayer insulating layer. The TSV structure 30 may have a sidewall surrounded by the semiconductor substrate and a side wall surrounded by the interlayer insulating layer.

In other embodiments, although not illustrated in FIGS. 1A-1C, the semiconductor structure 20 may include a semiconductor substrate, an interlayer insulating layer that covers the semiconductor substrate, and a metal interlayer insulating layer that covers the interlayer insulating layer. The TSV structure 30 may pass through the semiconductor substrate, the interlayer insulating layer, and the metal interlayer insulating layer. The TSV structure 30 may have a sidewall surrounded by the semiconductor substrate, a side wall surrounded by the interlayer insulating layer, and a side wall surrounded by the metal interlayer insulating layer.

Figure 1D:
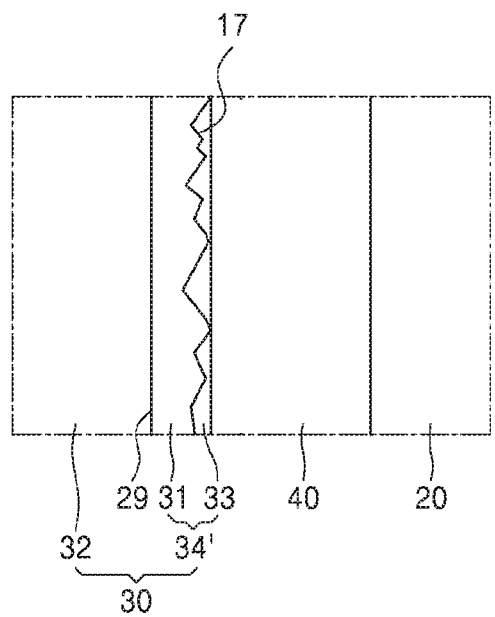
FIG. 1D is an enlarged sectional view of a section D of the IC device shown in FIG. 1, showing a potential configuration of structures in greater detail.

FIG. 1D is an enlarged sectional view of a section D to illustrate a modification of the embodiment shown in FIG. 1A, illustrating a potential configuration of structures. As shown in FIG. 1D, a conductive barrier layer 34' is arranged adjacent to a conductive structure 32. Other elements of this embodiment may be the same as or similar to the embodiments discussed in connection with FIGS. 1A-1C. For example, a via insulating layer 40 may be interposed between a semiconductor substrate 20 and the conductive barrier layer 34'. The conductive barrier layer 34' may be described as having an outer portion 33 oxidized between the conductive barrier layer 34' and the via insulating layer 40. The oxidized outer portion 33 may substantially surround the remaining portion 31 of the conductive barrier layer 34'. In FIG. 1A, the metal-containing insulating layer 50 has a substantially uniform width in cross-section. In FIG. 1D, however, the outer portion 33 (equivalent to the metal containing insulating layer 50 of FIG. 1A) of the conductive barrier layer 34' may have an uneven or jagged inner sidewall 17 as described below.

In some embodiments, a substantial portion of the conductive barrier layer 34' may not be oxidized (unoxidized). In some embodiments, substantially no oxide may be formed from the conductive structure 32. Thus, substantially no oxide may reside between the conductive structure 32 and the conductive barrier layer 34' within the spirit and scope of the present application.

Figure 1E:
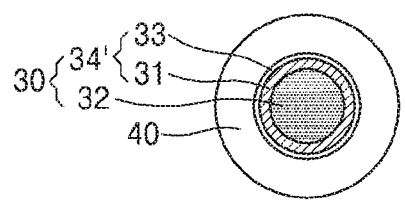
FIG. 1E is a cross-sectional view of the IC device of FIG. 1A, taken along line 1B-1B', similar to the cross-sectional view of FIG. 1B, but according to the structural configuration shown in FIG. 1D.

In some embodiments, as shown in FIG. 1E, the oxidized outer portion 33 of the conductive barrier layer 34' may be formed along substantially an entire perimeter thereof in plan view. The oxidized outer portion 33 of the conductive barrier layer 34' may have a substantially ring-shape structure in plan view.

In some embodiments, a thickness of the oxidized outer portion 33 of the conductive barrier layer 34' may range from about 2 Å to about 70 Å. Also, a thickness of the via insulating layer 40 may range from about 1000 Å to about 3000 Å.

The remaining portion 31 of the conductive barrier layer 34' may substantially surround the conductive structure 32. A thickness of the remaining portion 31 of the conductive barrier layer 34' may range from about 10 Å to about 100 Å.

The oxidized outer portion 33 of the conductive barrier layer 34' may have the uneven or jagged inner sidewall 17 that is contiguous with an outer sidewall of the remaining portion 31 of the conductive barrier layer 34' along substantially an entire depth of the via hole 22 in cross-sectional view.

An opposing sidewall of the remaining portion 31 of the conductive barrier layer 34' may be contiguous with an outer sidewall 29 of the conductive structure 32 along substantially an entire depth of the via hole 22.

Figure 1F:
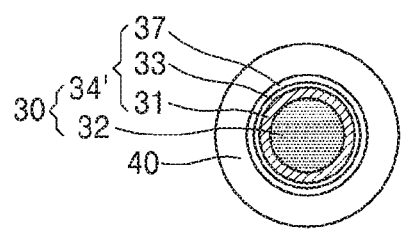
FIG. 1F is a cross-sectional view, similar to the cross-sectional view of FIG. 1B, according to the embodiment of FIG. 1E.

In other embodiments, as shown in FIG. 1F, a conductive barrier layer 34' may substantially surround the conductive structure 32, where the barrier layer 34' has a first layer 31 formed of a conductive component such as W, tungsten nitride (WN), tungsten carbide (WC), Ti, titanium nitride (TiN), Ta, TaN, ruthenium (Ru), cobalt (Co), manganese (Mn), Ni, or NiB and a second layer 37 formed of a nitride of the conductive component. The conductive barrier layer 34' may include an oxide layer of the conductive component disposed between the first layer 31 and the second layer 37. For example, a conductive layer (as the second layer 37) such as a TaN layer may be located between the via insulating layer 40 and the oxidized outer portion 33. In some embodiments, a TaN layer and a Ta layer may be sequentially formed before forming the conductive structure 32. The TaN layer may be very thin (a few angstroms, for example) or may be formed partially within the via hole 22. Such a TaN layer may help release the stress during the subsequent processes as a stress buffer layer. In some embodiments, TaN may exist in the form of dots or patches.

Figure 2:
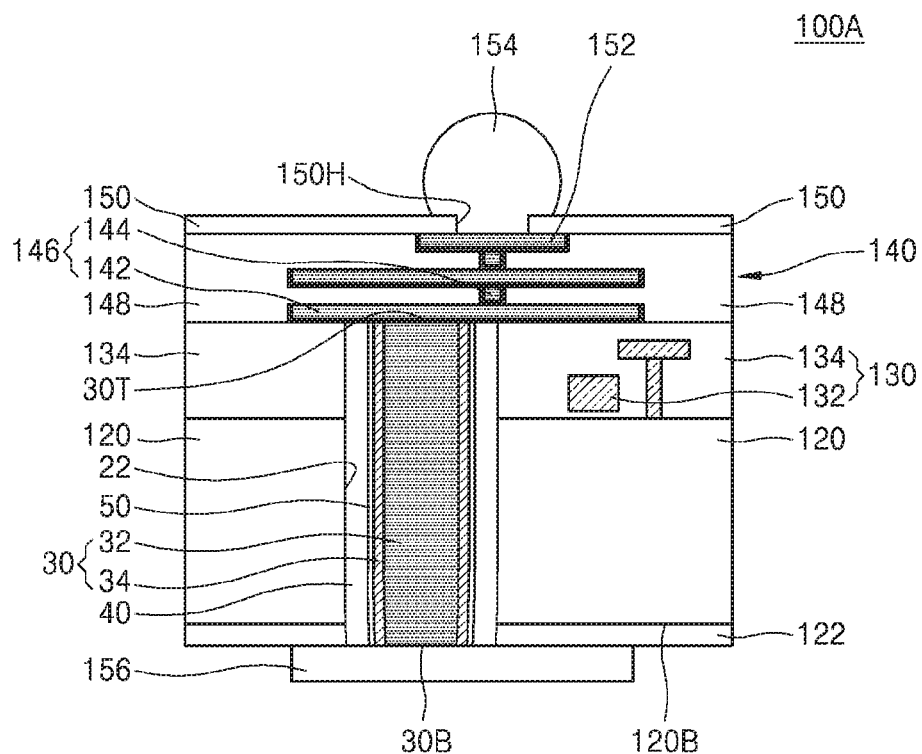
FIG. 2 is a cross-sectional view illustrating an IC device according to another embodiment of the inventive concepts.

FIG. 2 is a cross-sectional view illustrating an IC device 100A according to another embodiment of the inventive concept. In FIG. 2, the same reference numerals as those of FIGS. 1A and 1B refer to the same elements and detailed descriptions of the elements will not be repeated here.

An IC device 100A includes a substrate 120, a front-end-of-line (FEOL) structure 130, and a back-end-of-line (BEOL) structure 140. The TSV structure 30 is formed in the substrate 120 and the via hole 22 that passes through the FEOL structure 130. The via insulating layer 40 is interposed between the substrate 120 and the TSV structure 30 and between the FEOL structure 130 and the TSV structure 30.

The TSV structure 30 includes the conductive plug 32, which passes through the substrate 120 and the FEOL structure 130, and the conductive barrier layer 34 that substantially surrounds (or adjacent to) the conductive plug 32. The metal-containing insulating layer 50 may be interposed between the conductive barrier layer 34 and the via insulating layer 40.

The substrate 120 may be a semiconductor wafer. In at least one embodiment, the substrate 120 includes silicon (Si). In other embodiments, the substrate 120 may include a semiconductor atom such as germanium (Ge) or a compound semiconductor such as silicon carbide (SiC), gallium arsenide (GaAs), indium arsenide (InAs), and indium phosphide (InP). In at least one embodiment, the substrate 120 may have a silicon on insulator (SOI) structure. For example, the substrate 120 may include a buried oxide (BOX) layer. In some embodiments, the substrate 120 may include a conductive region, for example, an impurity doped well or an impurity-doped structure. In addition, the substrate 120 may have various isolation structures such as a shallow trench isolation (STI) structure. A bottom surface 120B of the substrate 120 may be covered with a lower insulating layer 122. The lower insulating layer 122 may be formed of a silicon oxide layer, a silicon nitride layer, polymer, or a combination thereof.

The FEOL structure 130 includes various kinds of a plurality of individual devices 132 and an interlayer insulating layer 134. The plurality of individual devices 132 may include various microelectronic devices, for example, an image sensor such as a metal-oxide-semiconductor field effect transistor (MOSFET), a large scale integration (LSI) system, and a complementary metal-oxide-semiconductor (CMOS) imaging sensor (CIS), a micro-electro-mechanical system (MEMS), an active device, and a passive device. The plurality of individual devices 132 may be electrically connected to a conductive region of the substrate 120. In addition, the plurality of individual devices 132 may be electrically isolated from adjacent individual devices by the interlayer insulating layer 134, respectively.

The BEOL structure 140 includes a multilayer wiring structure 146 formed of a plurality of conductive wiring lines 142 and a plurality of contact plugs 144. The multilayer wiring structure 146 may be connected to the TSV structure 30.

In some embodiments, the BEOL structure 140 may further include other multilayer wiring structures including a plurality of conductive wiring lines and a plurality of contact plugs in another region on the substrate 120. The BEOL structure 140 may include a plurality of wiring structures for connecting the individual devices included in the FEOL structure 130 to other wiring lines. The multilayer wiring structure 146 and the other wiring line structures included in the BEOL structure 140 may be insulated from each other by a metal interlayer insulating layer 148. In some embodiments, the BEOL structure 140 may further include a seal ring (not illustrated) for protecting the plurality of wiring structures and other structures thereunder against external shock or moisture.

The top surface 30T of the TSV structure 30 extended through the substrate 120 and the FEOL structure 130 may be connected to the conductive wring lines 142 of the multilayer wiring structure 146 included in the BEOL structure 140.

An upper insulating layer 150 may be formed on the metal interlayer insulating layer 148. The upper insulating layer 150 may be formed of a silicon oxide layer, a silicon nitride layer, polymer, or a combination thereof. A hole 150H that exposes a bonding pad 152 connected to the multilayer wiring structure 146 is formed in the upper insulating layer 150. The bonding pad 152 may be connected to an upper contact terminal 154 through the hole 150H. The bottom surface 30B of the TSV structure 30 may be connected to a lower contact terminal 156.

The upper contact terminal 154 and the lower contact terminal 156 are not limited to having the shapes illustrated in FIG. 2 but may be in the form of a solder ball, a conductive bump, a rewiring structure, or a contact pad. In some embodiments, at least one of the upper contact terminal 154 and the lower contact terminal 156 may be omitted.

In processes of forming the BEOL structure 140, the upper contact terminal 154 and the lower contact terminal 156 may be formed after the TSV structure 30 is formed. At least one of the processes of forming the BEOL structure 140, the upper contact terminal 154, and the lower contact terminal 156 may be accompanied by a thermal process. For example, while forming the multilayer wiring structure 146 included in the BEOL structure 140 or while forming the upper contact terminal 154 or the lower contact terminal 156, thermal energy applied to the via insulating layer 40 that surrounds the TSV structure 30 may cause thermal stress. As a result, outgassing of moisture and impurities from the via insulating layer 40 may occur. In processes of manufacturing the IC device 100A according to the inventive concept, after forming the via insulating layer 40, and before forming the TSV structure 30, a degassing process of performing thermal processing on the moisture absorbing via insulating layer 40 at an optimal temperature may be performed so that outgassing for discharging moisture and various impurities undesirably contained in the via insulating layer 40 to the outside may be induced and the via insulating layer 40 may be densified. As a result, outgassing of the moisture and impurities from the via insulating layer 40 or physical deformation of the via insulating layer 40 may be induced to be performed before the TSV structure 30 is formed. Otherwise, outgassing of the moisture and impurities from the via insulating layer 40 or physical deformation of the via insulating layer 40 may be undesirably caused when the thermal energy is applied to the via insulating layer 40 in a subsequent process performed after the TSV structure 30 is formed on the via insulating layer 40 that undergoes the degassing process. Accordingly, after the TSV structure is formed, while performing the subsequent process, for example, a process of forming the multilayer wiring structure 146 of the BEOL structure 140 or a process of forming the upper contact terminal 154 or the lower contact terminal 156, it may be possible to substantially prevent the TSV structure 30 from being deteriorated due to chemical and physical deformation caused by the thermal energy applied to the via insulating layer 40.

For example, after forming the via insulating layer 40, when the degassing process for the moisture absorbing via insulating layer 40 is omitted or the thermal processing is performed at a lower temperature than an optimal temperature range so that an insufficient degassing process is performed, in the subsequent process of forming the multilayer wiring structure 146 or forming the upper contact terminal 154 or the lower contact terminal 156, due to the thermal energy applied to the via insulating layer 40, large amounts of various impurities including moisture are outgassed from the via insulating layer 40 to be diffused into the TSV structure 30. As a result, all the conductive barrier layer 34 of the TSV structure 30 may be oxidized and an adhesive force between the conductive barrier layer 34 and the conductive pug 32 of the TSV structure 30 may be deteriorated and thus, delamination may occur between the conductive barrier layer 34 and the conductive plug 32. In addition, the physical deformation caused by the thermal energy applied to the via insulating layer 40 may have an undesirable adverse physical effect on the TSV structure 30.

However, in the processes of manufacturing the IC device 100A according to the inventive concept, after forming the via insulating layer 40, and before forming the TSV structure 30, a degassing process is performed that includes performing thermal processing on the moisture absorbing via insulating layer 40 at an optimal temperature, for example, at a temperature in a range of about 300° C. to about 500° C. Accordingly, the TSV structure 30 may be formed after most of the moisture and various impurities undesirably contained in the via insulating layer 40 are discharged to the outside and the via insulating layer 40 is densified. Therefore, while performing the subsequent thermal process, for example, the process of forming the multilayer wiring structure 146 of the BEOL structure 140 or the process of forming the upper contact terminal 154 or the lower contact terminal 156 on a resultant structure in which the TSV structure 30 is formed, only very small amounts of moisture and impurities that reside in the via insulating layer 40 may be outgassed. Due to the small amounts of outgassed moisture and impurities, a part of the conductive barrier layer 34 may be oxidized between the conductive barrier layer 34 of the TSV structure 30 and the via insulating layer 40, for example, at the interface thereof, so that the metal-containing insulating layer 50 having a very small thickness, for example, a thickness of about 2 Å to about 50 Å, which does not have an adverse effect on a function of the TSV structure 30, may be formed at the interface between the conductive barrier layer 34 of the TSV structure 30 and the via insulating layer 40.

When the temperature of the degassing process is lower than 300° C., an effect of the degassing process may be insufficient. Therefore, when the subsequent process accompanied by the thermal process is performed after the TSV structure 30 is formed, the amounts of moisture and impurities outgassed from the via insulating layer 40 may increase. As a result, all of the conductive barrier layer 34 could be oxidized to form a metal oxide layer (for example, a $TaO_x$ layer). Here, when the conductive barrier layer 34 has a lamination structure of a metal nitride layer having small thicknesses and a metal layer, the metal nitride layer is too thin to be seen and only a thickness of the metal layer of the conductive barrier layer 34 may be checked. Therefore, all of the metal layer of the conductive barrier layer 34 may be oxidized such that all of the conductive barrier layer 34 may be changed into the metal oxide layer. In addition, a portion of the conductive plug 32, which is adjacent to the conductive barrier layer 34, may be oxidized to be changed into a metal oxide layer (for example, a $CuO_x$ layer). At this time, an interface exists between the metal oxide layer (for example, the $TaO_x$ layer) that results from oxidization of the conductive barrier layer 34 and the metal oxide layer (for example, the $CuO_x$ layer) that results from oxidization of the conductive plug 32 and the adhesive force may be deteriorated at the interface resulting in the delamination between the conductive barrier layer 34 and the conductive plug 32. In addition, when the temperature of the degassing process is higher than 500° C., electrical characteristics of unit devices, for example, transistors, included in the substrate 120 or the FEOL structure 130 may be deteriorated.

As described above, the metal-containing insulating layer 50 may be formed while performing the subsequent thermal process after forming the TSV structure 30, for example, the process of forming the multilayer wiring structure 146 of the BEOL structure 140 or the process of forming the upper contact terminal 154 or the lower contact terminal 156. However, according to the inventive concept, the thermal process of forming the metal-containing insulating layer 50 is not limited thereto but the metal-containing insulating layer 50 may be formed while performing various other processes after forming the TSV structure 30, at the same time as the thermal process. For example, the metal-containing insulating layer 50 may be formed during a packaging process of the IC device 100A including the TSV structure 30.

As described above, a portion of the conductive barrier layer 34 may be oxidized to form the metal-containing insulating layer 50. In some embodiments, only a portion of the conductive barrier layer 34 may be oxidized to form the metal-containing insulating layer 50. Therefore, when the conductive barrier layer 34 includes a first metal, the metal-containing insulating layer 50 includes an oxide of the first metal. For example, when the conductive barrier layer 34 includes a Ta layer, the metal-containing insulating layer 50 may include an oxide of Ta. When the conductive barrier layer 34 has a two-layer structure of a tantalum nitride (TaN) layer and a Ta layer, the metal-containing insulating layer 50 may include an oxynitride of Ta.

In the IC device 100A illustrated in FIG. 2, the conductive barrier layer 34 may include a first external wall covered with (or adjacent to) the substrate 120 and a second external wall covered with (or adjacent to) the interlayer insulating layer 134. The metal-containing insulating layer 50 may include a first portion covered with (or adjacent to) the substrate 120 and a second portion covered with (or adjacent to) the interlayer insulating layer 134.

Figure 3:
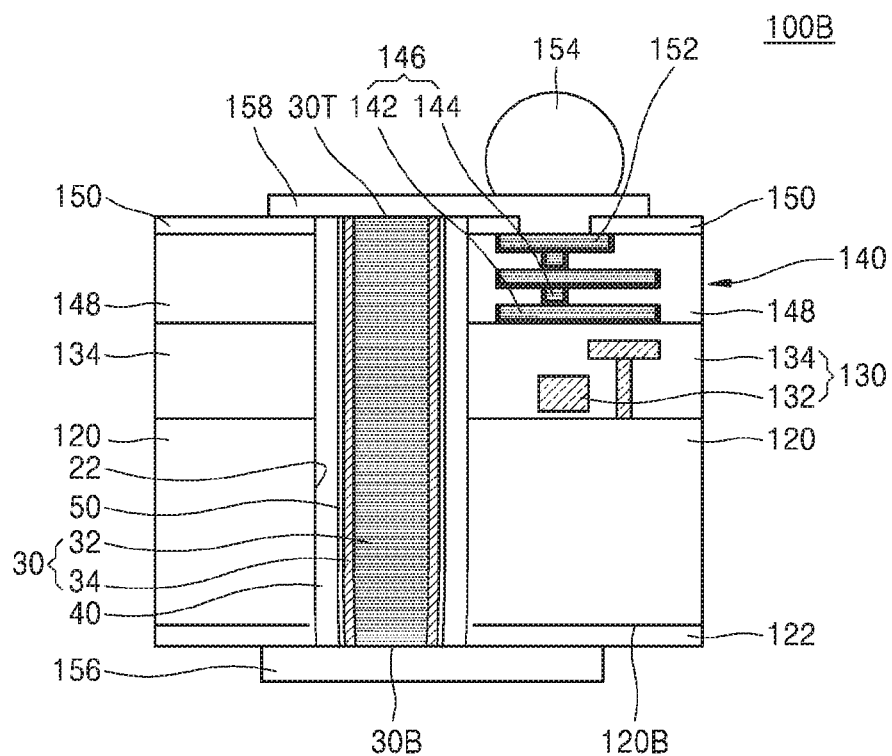
FIG. 3 is a cross-sectional view illustrating an IC device according to another embodiment of the inventive concepts.

FIG. 3 is a cross-sectional view illustrating an IC device 100B according to another embodiment of the inventive concept. In FIG. 3, the same reference numerals as those of FIGS. 1A to 2 refer to the same elements and detailed descriptions of the elements will not be repeated here.

In an IC device 100B, the TSV structure 30 may be formed after forming the FEOL structure 130 and the BEOL structure 140. Therefore, the TSV structure 30 is formed to pass through the substrate 120, the interlayer insulating layer 134 of the FEOL structure 130, and the metal interlayer insulating layer 148 of the BEOL structure 140. The conductive barrier layer 34 of the TSV structure 30 includes a first external wall surrounded by (adjacent to) the substrate 120, a second external wall surrounded by (adjacent to) the interlayer insulating layer 134, and a third external wall surrounded by (adjacent to) the metal interlayer insulating layer 148. The metal-containing insulating layer 50 includes a first portion that covers the first external wall, a second portion that covers the second external wall, and a third portion that covers the third external wall.

In order to electrically connect the TSV structure 30 and the upper contact terminal 154, an upper wiring line 158 extends between the TSV structure 30 and the upper contact terminal 154 on the BEOL structure 140. The TSV structure 30 passes through the upper insulating layer 150 to be connected to the upper wiring line 158 and may be connected to the upper contact terminal 154 through the upper wiring line 158.

In processes of forming the upper wiring line 158, the upper contact terminal 154 and the lower contact terminal 156 are formed after forming the TSV structure 30. At least one of the processes of forming the upper wiring line 158, the upper contact terminal 154, and the lower contact terminal 156 may be accompanied by a thermal process. While the thermal process is performed, thermal energy is applied to the via insulating layer 40 that surrounds the TSV structure 30 and thus, thermal stress may be applied. As a result, outgassing of moisture and impurities from the via insulating layer 40 may occur. In processes of manufacturing the IC device 100B according to the inventive concept, after forming the via insulating layer 40, and before forming the TSV structure 30, a degassing process of performing thermal processing on the moisture absorbing via insulating layer 40 at an optimal temperature, for example, at a temperature in a range of about 300° C. to about 500° C., may be performed so that outgassing for discharging the moisture and various impurities undesirably contained in the via insulating layer 40 to the outside may be induced and the via insulating layer 40 may be densified. After forming the TSV structure 30 on the via insulating layer 40 densified through the outgassing process, while performing subsequent processes, for example, the processes of forming the upper wiring line 158, the upper contact terminal 154, and the lower contact terminal 156, only tiny amounts of moisture and impurities that reside in the via insulating layer 40 may be outgassed. Due to the tiny amounts of outgassed moisture and impurities, a portion of the conductive barrier layer 34 may be oxidized (for example, at the interface) between the conductive barrier layer 34 of the TSV structure 30 and the via insulating layer 40 so that the metal-containing insulating layer 50 having a very small thickness, for example, a thickness of about 2 Å to 50 Å, which does not have an adverse effect on the function of the TSV structure 30, may be formed at the interface between the conductive barrier layer 34 of the TSV structure 30 and the via insulating layer 40. Therefore, while performing the processes of forming the upper wiring line 158, the upper contact terminal 154, and the lower contact terminal 156, it is possible to substantially prevent the TSV structure 30 from being deteriorated due to chemical and physical deformation caused by the thermal energy applied to the via insulating layer 40.

Figure 4:
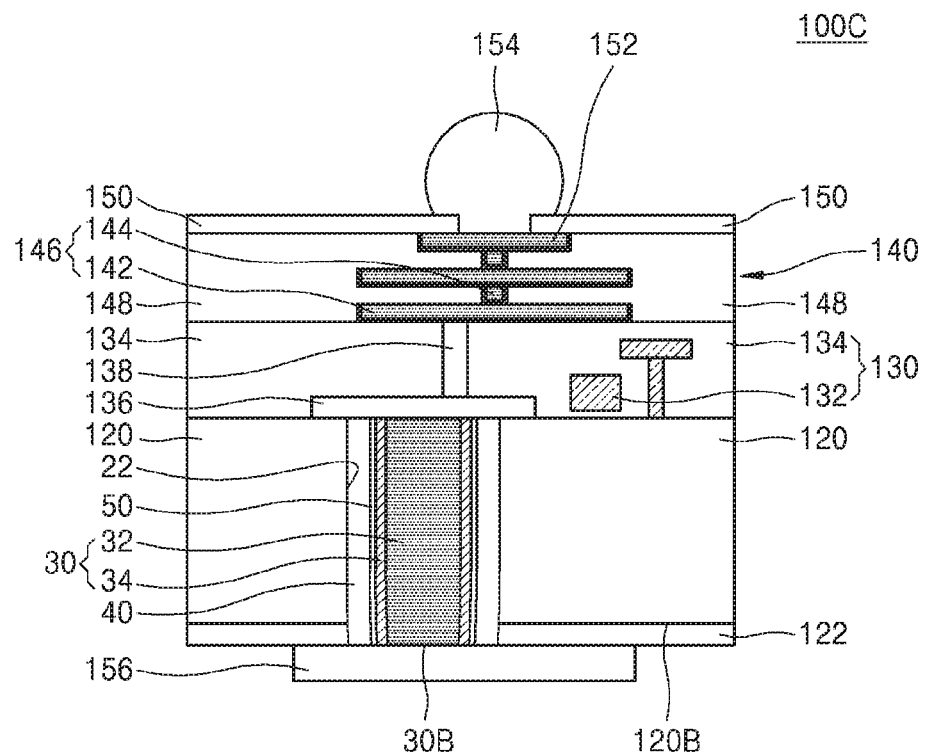
FIG. 4 is a cross-sectional view illustrating an IC device according to another embodiment of the inventive concepts.

FIG. 4 is a cross-sectional view illustrating an IC device 100C according to another embodiment of the inventive concepts. In FIG. 4, the same reference numerals as those of FIGS. 1A to 3 refer to the same elements and detailed descriptions of the elements will not be repeated here.

In an IC device 100C, the TSV structure 30 is extended to pass through the substrate 120. After the TSV structure 30 is formed, the FEOL structure 130 and the BEOL structure 140 are formed on the TSV structure 30 and the substrate 120. The TSV structure 30 may be connected to the multilayer wiring structure 146 of the BEOL structure 140 through connection wiring lines 136 and 138 included in the FEOL structure 130.

While performing a subsequent thermal process, for example, a process of forming the FEOL structure 130, a process of forming the BEOL structure 140, or a process of forming the upper contact terminal 154 or the lower contact terminal 156 on a resultant structure in which the TSV structure 30 is formed, very small amounts of moisture and impurities that reside in the via insulating layer 40 are outgassed and a portion of the conductive barrier layer 34 that forms the TSV structure 30 may be oxidized such that the metal-containing insulating layer 50 interposed between the TSV structure 30 and the via insulating layer 40 may be formed.

In processes of manufacturing the IC device 100C according to the inventive concepts, after forming the via insulating layer 40, and before forming the TSV structure 30, a degassing process of performing thermal processing on the moisture absorbing via insulating layer 40 at an optimal temperature, for example, at a temperature in a range of about 300° C. to about 500° C. may be performed so that outgassing for discharging moisture and various impurities undesirably contained in the via insulating layer 40 to the outside may be induced and the via insulating layer 40 may be densified. After forming the TSV structure 30 on the via insulating layer 40 densified through the outgassing process, while performing subsequent processes accompanied by a thermal process, only very small amounts of moisture and impurities that reside in the via insulating layer 40 may be outgassed. Due to very small amounts of outgassed moisture and impurities, a portion of the conductive barrier layer 34 may be oxidized (for example, at the interface) between the conductive barrier layer 34 of the TSV structure 30 and the via insulating layer 40 so that the metal-containing insulating layer 50 having a very small thickness, for example, a thickness of about 2 Å to about 50 Å, which does not have an adverse effect on the function of the TSV structure 30, may be formed at the interface between the conductive barrier layer 34 of the TSV structure 30 and the via insulating layer 40. Therefore, while performing the process of forming the FEOL structure 130, the process of forming the BEOL structure 140, or the process of forming the upper contact terminal 154 or the lower contact terminal 156, it is possible to substantially prevent the TSV structure 30 from being deteriorated due to chemical and physical deformation caused by the thermal energy applied to the via insulating layer 40.

Figure 5:
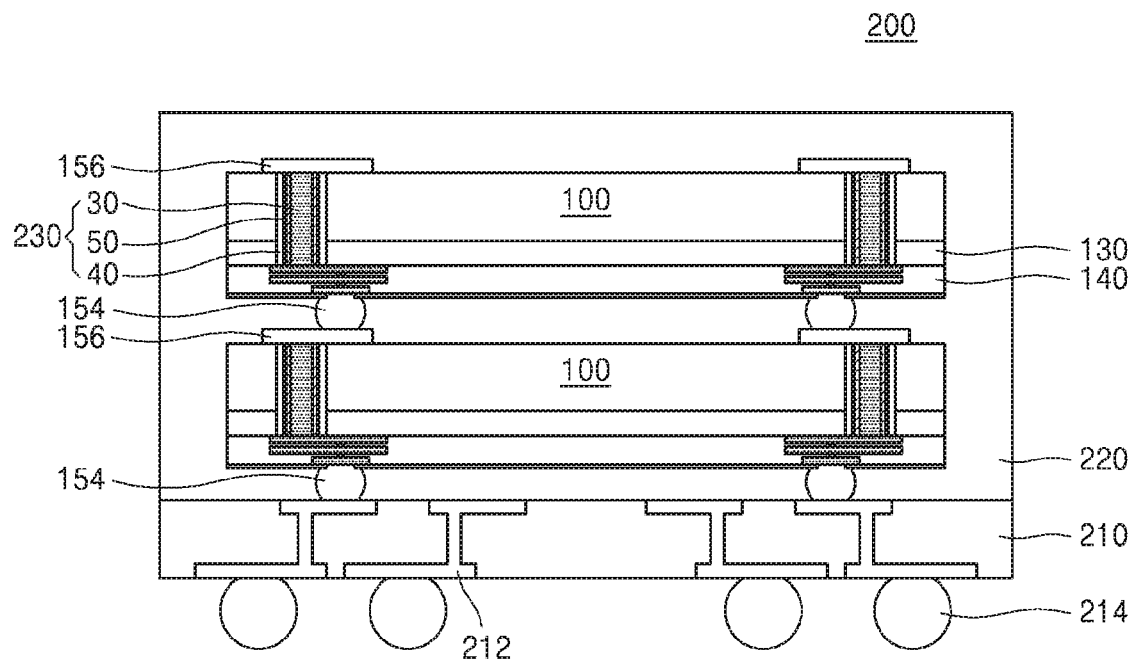
FIG. 5 is a cross-sectional view illustrating schematic elements of a semiconductor package according to an embodiment of the inventive concepts.

FIG. 5 is a cross-sectional view illustrating schematic elements of a semiconductor package 200 according to an embodiment of the inventive concepts. In FIG. 5, the same reference numerals as those of FIG. 4 refer to the same elements and detailed descriptions of the elements will not be repeated here.

Referring to FIG. 5, the semiconductor package 200 may include a package substrate 210 and at least one IC device 100 mounted on the package substrate 210.

In some embodiments, the package substrate 210 may be a printed circuit board (PCB) in which wiring structures 212 are formed.

In FIG. 5, the semiconductor package 200 mounted with two IC devices 100 is illustrated. However, the inventive concept is not limited thereto but various numbers of IC devices 100 may be vertically or horizontally mounted on the package substrate 210. In FIG. 5, for descriptive convenience, partial elements of the IC device 100 are omitted and simplified. However, in accordance with the inventive concept, the at least one IC device 100 may have at least one structure among the structures of the IC devices 10A, 100A, 100B, and 100C illustrated in FIGS. 1A to 4.

A plurality of contact terminals 214 connected to the wiring structures 212 in the package substrate 210 are formed in the package substrate 210 for electrical connection to the outside. In some embodiments, the plurality of contact terminals 214 may be formed of conductive balls such as solder balls. However, the inventive concepts are not limited thereto.

Electrical connection between the package substrate 210 and the IC device 100 or electrical connection between the two adjacent IC devices 100 may be achieved through the TSV structure formed in the IC device 100. The TSV structure 30, the via insulating layer 40 that surrounds the TSV structure 30, and the metal-containing insulating layer 50 interposed between the TSV structure 30 and the via insulating layer 40 form a TSV unit 230.

The semiconductor package 200 may include a molding layer 220 for molding at least one IC device 100. In some embodiments, the molding layer 220 may be formed of polymer. For example, the molding layer 220 may be formed of an epoxy molding compound.

Figure 6:
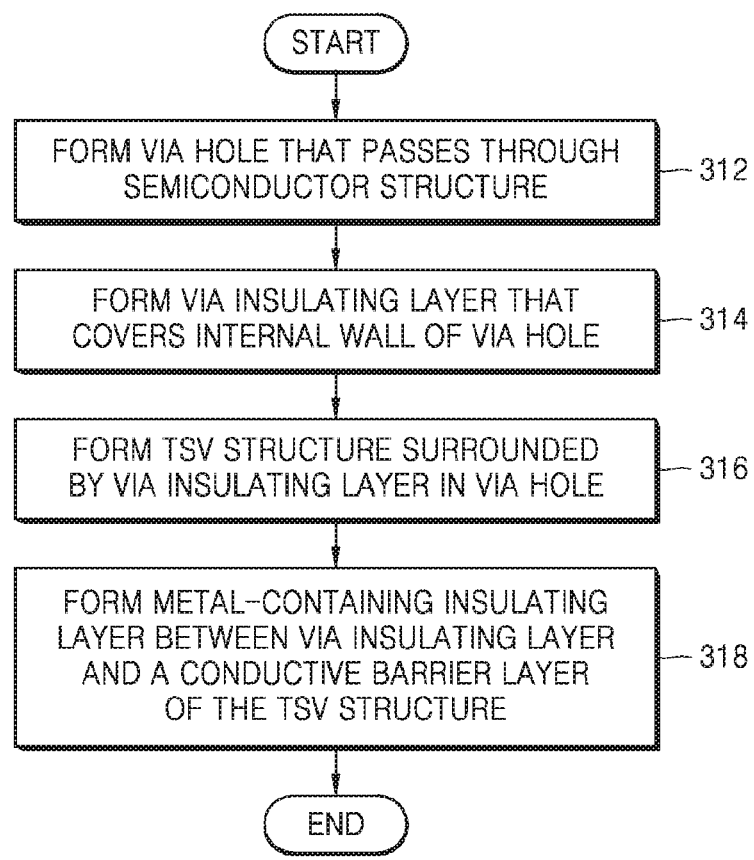
FIG. 6 is a flowchart illustrating a method of manufacturing an IC device according to an embodiment of the inventive concepts.

FIG. 6 is a flowchart illustrating a method of manufacturing an IC device according to an embodiment of the inventive concepts. Hereinafter, redundant or repeated descriptions of elements described with reference to FIGS. 1A and 1B will not be made here.

Referring to FIGS. 1A, 1B, and 6, in a process 312, the via hole 22 that passes through the semiconductor structure 20 is formed.

The semiconductor structure 20 includes the substrate 120 illustrated in FIGS. 2 to 4.

In a process 314, the via insulating layer 40 that covers an internal wall of the via hole 22 is formed.

In order to form the via insulating layer 40, a low temperature CVD process or a plasma enhanced CVD (PECVD) process may be performed.

In a process 316, the TSV structure surrounded by the via insulating layer 40 is formed in the via hole 22. In order to form the TSV structure 30, after forming the conductive barrier layer 34 that covers the via insulating layer 40 in the via hole 22, the conductive plug 32 that fills the remaining space of the via hole 22 may be formed.

The PVD or CVD process may be used for forming the conductive barrier layer 34. In some embodiments, in order to form the conductive barrier layer 34, a TaN layer of about 50 Å to about 200 Å and a Ta layer of about 1,000 Å to about 3,000 Å may be sequentially formed.

The conductive barrier layer 34 may have a variable thickness along the longitudinal direction of the via hole 22. For example, a thickness of the conductive barrier layer 34 on a side of the first surface 20T of the semiconductor structure 20 may be larger than that on a side of the second surface 20B of the semiconductor structure 20.

In a process 318, the metal-containing insulating layer 50 interposed between the via insulating layer 40 and the conductive barrier layer 34 of the TSV structure 30 is formed.

A portion of the conductive barrier layer 34 may be oxidized (for example, at the interface) between the via insulating layer 40 and the conductive barrier layer 34 so that the metal-containing insulating layer 50 may be formed.

Figure 7:
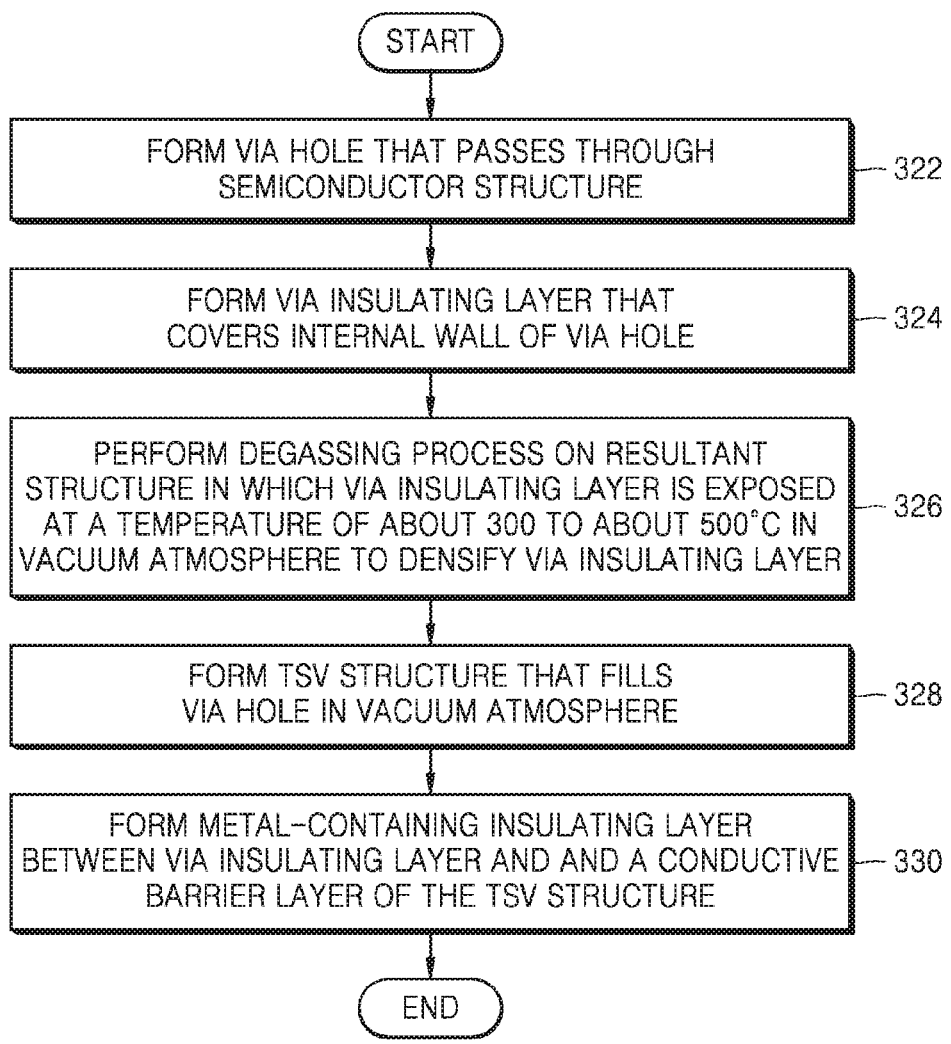
FIG. 7 is a flowchart illustrating a method of manufacturing an IC device according to another embodiment of the inventive concepts.

FIG. 7 is a flowchart illustrating a method of manufacturing an IC device according to another embodiment of the inventive concept. Hereinafter, redundant descriptions of elements described with reference to FIGS. 1A and 1B will not be repeated here.

Referring to FIGS. 1A, 1B, and 7, in a process 322, the via hole 22 that passes through the semiconductor structure 20 is formed.

The semiconductor structure 20 includes the substrate 120 illustrated in FIGS. 2 to 4.

In a process 324, the via insulating layer 40 that covers the internal wall of the via hole 22 is formed.

The via insulating layer 40 may be formed by the method described with reference to the process 314 of FIG. 6.

In a process 326, a degassing process may be performed on the resultant structure in which the via insulating layer 40 is exposed in a vacuum atmosphere so that the via insulating layer 40 is densified.

In a process 328, a TSV structure may be formed by the method described with reference to the process 316 of FIG. 6. For example, a conductive barrier layer is formed on the via insulating layer within the via hole. The via hole is then filled with a conductive plug or conductive structure to form the TSV structure.

In a process 330, a metal-containing insulating layer may be formed by the method described with reference to the process 318 of FIG. 6. For example, according to some embodiments, the resulting structure is heat treated such that an outer portion of the conductive barrier layer is oxidized. (One can say that the metal-containing insulating layer (equivalent to the oxidized outer portion) is formed between the via insulating layer and the conductive barrier layer.) The oxidized outer portion of the conductive barrier layer may substantially surround the remaining portion of the conductive barrier layer.

In some embodiments, the degassing of the via insulating layer and the forming of the conductive barrier layer are performed in situ and in a vacuum atmosphere. The degassing of the via insulating layer and the forming of the conductive barrier layer may be performed in a physical vapor deposition (PVD) chamber.

In some embodiments, the oxidized outer portion of the conductive barrier layer has a thickness of not more than about 50 Å. Also, a thickness of the remaining portion of the conductive barrier layer may range from about 10 Å to about 100 Å.

In some embodiments, a seed layer may be formed before filing the via hole with the conductive structure. The formation of the seed layer may be performed in situ with the formation of the conductive structure in a vacuum atmosphere.

In some embodiments, the degassing process may be performed at a temperature of about 300° C. to about 500° C. and under a pressure of about $10^{-3}$ Torr to about $10^{-4}$ Torr for about 30 seconds to about 5 minutes.

In some embodiments, such as in the case of a logic device, the degassing process may be performed within a temperature range of about 350° C. to about 400° C. More preferably, the degassing process may be performed at about 375° C.

In some embodiments, such as in the case of a memory device, the degassing process may be performed within a temperature range of about 375° C. to about 500° C.

In some embodiments, the degassing process may be performed within the temperature range that allows the oxidized outer portion of the conductive barrier layer to substantially surround the remaining portion of the conductive barrier layer during the heat treating process.

In some embodiments, the degassing of the via insulating layer 40, the forming of the conductive barrier layer, and the forming of the conductive structure are performed in situ and in a vacuum atmosphere.

While performing the degassing process, moisture and various impurities undesirably contained in the via insulating layer 40 may be discharged to the outside so that the densified via insulating layer 40 may be obtained.

The degassing process is performed on the via insulating layer 40 so that amounts of the moisture and impurities outgassed from the via insulating layer 40 when thermal energy is applied to the via insulating layer 40 in a subsequent process may be substantially reduced. In addition, physical deformation of the via insulating layer 40 is previously performed before the TSV structure 30 is formed so that, while the subsequent thermal process is performed after the TSV structure 30 is formed, chemical and physical deformation caused by the thermal energy applied to the via insulating layer 40 may be substantially reduced. Therefore, it is possible to substantially prevent delamination from occurring in the TSV structure 30 or to prevent an electrical characteristic of the TSV structure 30 from deteriorating due to outgassing of the moisture and impurities from the via insulating layer 40 or the physical deformation of the via insulating layer 40 after the TSV structure 30 is formed.

Figure 8:
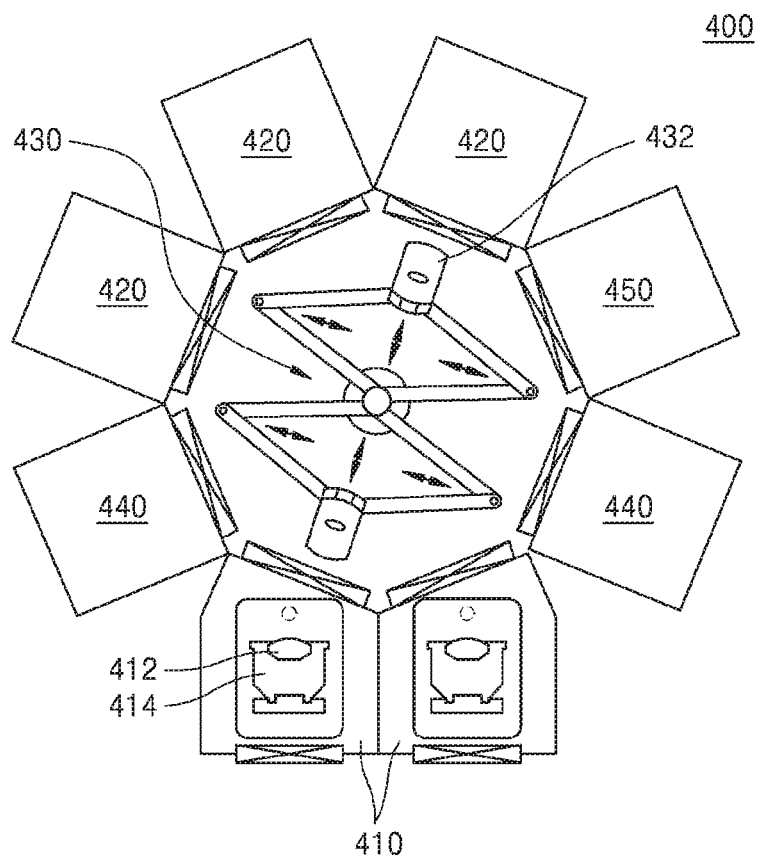
FIG. 8 is a plan view schematically illustrating elements of an exemplary semiconductor device manufacturing apparatus that may be used in a method of manufacturing an IC device according to an embodiment of the inventive concepts.

FIG. 8 is a plan view schematically illustrating elements of an exemplary semiconductor device manufacturing apparatus 400 that may be used for performing the degassing process by the process 326 of FIG. 7.

Referring to FIG. 8, a semiconductor device manufacturing apparatus 400 includes a plurality of load lock chambers 410 for respectively accommodating a cassette 414 mounted with a plurality of wafers 412, a plurality of process chambers 420 for performing predetermined semiconductor device manufacturing processes on the wafers 412, a transfer chamber 430 that includes a robot arm 432 for transferring the wafers 412 and that may be connected to the plurality of process chambers 420 and the load lock chambers 410, alignment chambers 440 for aligning the wafers 412 on which the predetermined semiconductor device manufacturing processes are to be performed in the process chambers 420 in one direction, and a degassing chamber 450 for performing a degassing process for removing foreign substances such as moisture or impurities from the wafers 412 aligned in the alignment chambers 440.

Figure 9:
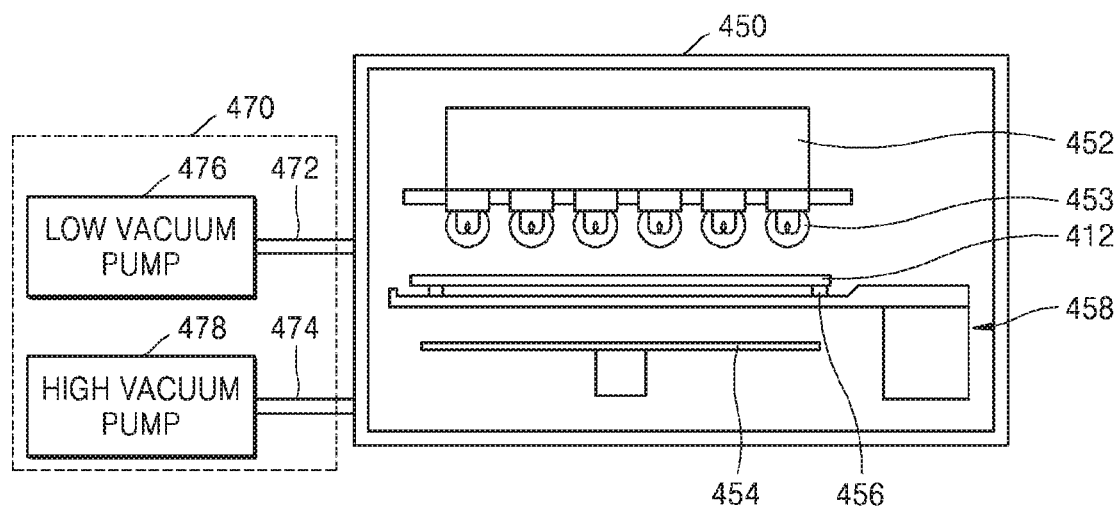
FIG. 9 is a cross-sectional view illustrating exemplary elements of a degassing chamber included in the semiconductor device manufacturing apparatus of FIG. 8.

FIG. 9 is a cross-sectional view illustrating exemplary elements of the degassing chamber 450 included in the semiconductor device manufacturing apparatus 400 of FIG. 8.

Referring to FIG. 9, the degassing chamber 450 is closed to the outside to provide an independent space in order to remove foreign substances such as moisture and impurities that reside in the wafer 412. The degassing chamber 450 includes a heater 452 for heating the wafer 412 at a high temperature, for example, at a temperature of about 300° C. to about 500° C., a rotation chuck 454 for rotating the wafer 412 in a lower end of the degassing chamber 450 to correspond to the heater 452, and a wafer holder 458 for lifting the wafer 412 from the rotation chuck 454. The wafer holder 458 includes a plurality of pins 456 that may support the wafer 412.

The wafer holder 458 may lower the wafer 412 loaded thereon to settle the wafer 412 on the rotation chuck 454. The wafer 412 settled on the rotation chuck 454 may be heated by the heater 452.

The heater 452 may rapidly heat the wafer 412 at a temperature required for degassing to discharge the foreign substances, such as the moisture and impurities absorbed into or included in the wafer 412, to the outside. The heater 452 may include a plurality of heating lamps 453 arranged at uniform intervals. The plurality of heating lamps 453 may rapidly heat the wafer 412 in the degassing chamber 450 at an optimal degassing temperature in a range of about 300° C. to about 500° C. using a power supply voltage applied from the outside.

In FIG. 9, it is illustrated that the heater 452 is provided in an upper part of the degassing chamber 450. However, the inventive concept is not limited thereto. For example, the degassing chamber 450 may include a heater provided in a lower part thereof. In addition, it is illustrated that the heater 452 includes the plurality of heating lamps 453. However, the inventive concept is not limited thereto. For example, the degassing chamber 450 may include a heater in which power is applied to a heating wire so that a temperature of a coil is increased due to heat generated by a current.

A vacuum exhaust apparatus 470 may be connected to the degassing chamber 450. The vacuum exhaust apparatus 470 may reduce the internal pressure of the degassing chamber 450 to maintain the degassing chamber 450 in a vacuous state. The vacuum exhaust apparatus 470 may include exhaust lines 472 and 474, which may be connected to the degassing chamber 450 so that a gas in the degassing chamber 450 may be discharged to the outside, and a low vacuum pump 476 and a high vacuum pump 478 may be provided in the exhaust lines 472 and 474, respectively.

The process 326 of FIG. 7 may be performed in the degassing chamber 450 illustrated in FIGS. 8 and 9.

In a process 328 of FIG. 7, the TSV structure 30 is formed in the via hole 22 while maintaining the vacuum atmosphere in which the process 316 was performed.

In some embodiments, the process 328 may be performed in at least one of the plurality of process chambers 420 included in the semiconductor device manufacturing apparatus 400 illustrated in FIG. 8.

In order to form the TSV structure 30 in the process 328, after forming the conductive barrier layer 34 that covers the via insulating layer 40 densified by a similar method to that of the process 316 of FIG. 6, the conductive plug 32 that fills the remaining space of the via hole 22 may be formed. The process of forming the conductive barrier layer 34 and the process of the conductive plug 32 may be performed in different process chambers 420.

In a process 330 of FIG. 7, the metal-containing insulating layer 50 interposed between the via insulating layer 40 and the TSV structure 30 is formed.

A portion of the conductive barrier layer 34 may be oxidized at the interface between the via insulating layer 40 and the conductive barrier layer 34 so that the metal-containing insulating layer 50 may be formed. For example, subsequent processes accompanied by a thermal process may be performed on a resultant structure including the TSV structure 30 formed in the process 328 and the process 330 of FIG. 7 may be one of the subsequent processes accompanied by the thermal process. At this time, very small amounts of moisture and impurities that reside in the via insulating layer 40 may be outgassed. Due to the very small amounts of outgassed moisture and impurities, the portion of the conductive barrier layer 34 may be oxidized (for example, at the interface) between the conductive barrier layer 34 of the TSV structure 30 and the via insulating layer 40 so that the metal-containing insulating layer 50 having a very small thickness, which does not have an adverse effect on the function of the TSV structure 30, may be formed.

Figure 10A:
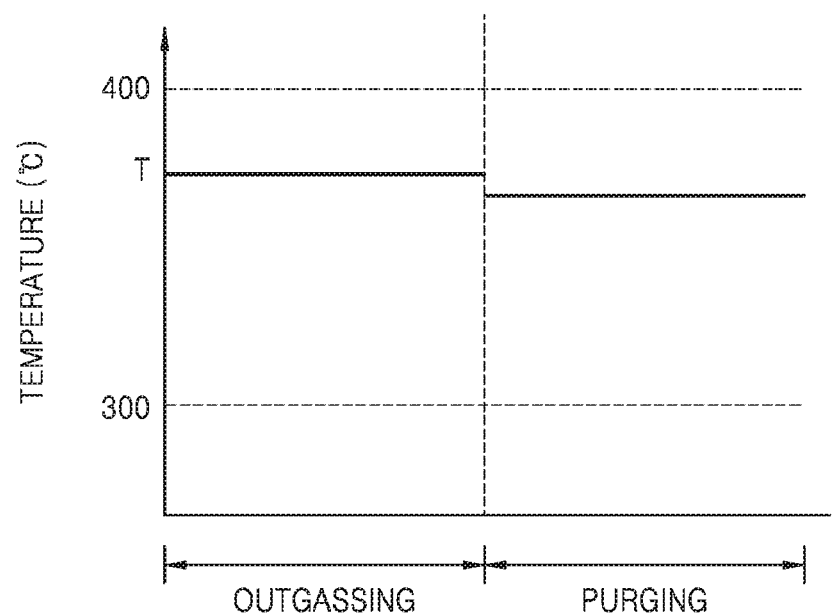
FIGS. 10A and 10B are graphs illustrating various temperature controlling methods that may be applied to a degassing process of a via insulating layer in a method of manufacturing an IC device according to an embodiment of the inventive concepts.
Figure 10B:
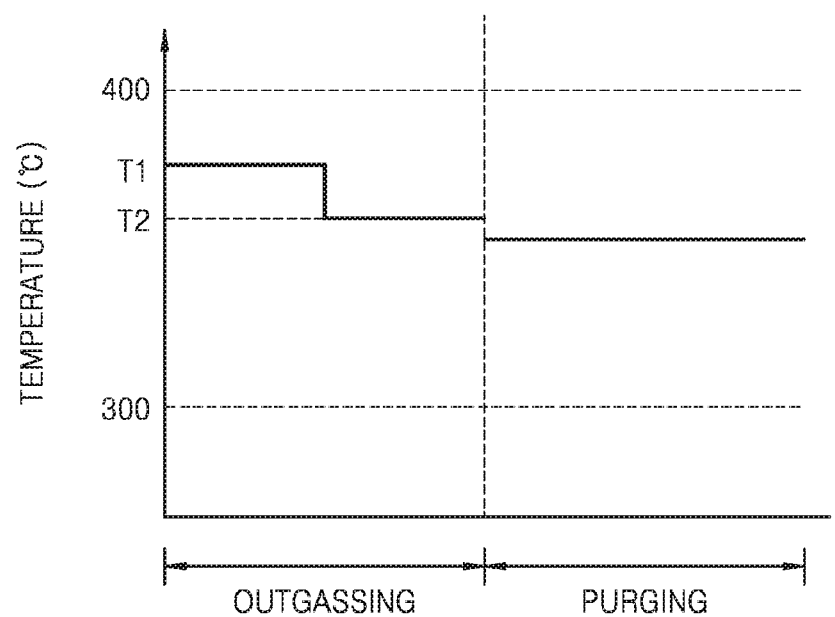

FIGS. 10A and 10B are graphs illustrating various temperature controlling methods that may be applied to a degassing process of the via insulating layer 40 in a method of manufacturing an IC device according to the inventive concept.

Referring to FIG. 10A, a degassing process of the via insulating layer 40 in a method of manufacturing an IC device according to the inventive concept includes an outgassing process and a purging process performed as a subsequent process of the outgassing process.

In some embodiments, during the degassing process of the via insulating layer 40, the outgassing process may be performed for about one minute. In this case, an internal temperature of the degassing chamber 450 may be substantially uniformly maintained as a degassing temperature T in a range of about 300° C. to about 500° C. For example, the degassing temperature T may be in a range of about 320° C. to about 380° C.

After the degassing process, an inert gas, for example, helium (He) or argon (Ar) may be supplied to the degassing chamber 450 so that the purging process may be performed. In some embodiments, the purging process may be performed for about one minute. During the purging process, the internal temperature of the degassing chamber 450 may be lower than the degassing temperature T. However, the inventive concepts are not limited thereto. For example, during the purging process, the internal temperature of the degassing chamber 450 may be maintained to be substantially the same as the degassing temperature T.

Referring to FIG. 10B, in the outgassing process during the degassing process of the via insulating layer 40 in the method of manufacturing an IC device according to the inventive concept, after a first degassing temperature T1 that is a high temperature in the range of about 300° C. to about 500° C. is maintained as the internal temperature of the degassing chamber 450 for a predetermined time, for example, for about 5 seconds to about 30 seconds, a second degassing temperature T2 that is a low temperature in the range of about 300° C. to about 500° C. may be maintained as the internal temperature of the degassing chamber 450 for a predetermined time, for example, about 30 seconds to about 55 seconds. As described above, during the degassing process, an initial temperature is set to be high so that a combination of the moisture or impurities included in the via insulating layer 40 and constituent materials of the via insulating layer 40 therearound is destroyed and the moisture or impurities may be easily discharged to the outside. In addition, a drop in the internal temperature of the degassing chamber 450 that may be caused during the purging process in the previous degassing process performed in the degassing chamber 450 may be rapidly recovered. After the degassing process, the purging process may be performed by the method described with reference to FIG. 10A. In some embodiments, the purging process may be performed for about one minute. The internal temperature of the degassing chamber 450 during the purging process may be lower than the second degassing temperature T2 during the degassing process. However, the inventive concept is not limited thereto. For example, the internal temperature of the degassing chamber 450 during the purging process may be maintained to be the same as the second degassing temperature T2 during the degassing process.

Hereinafter, methods of manufacturing IC devices according to the inventive concept will be described in detail with specific examples.

Figure 11A:
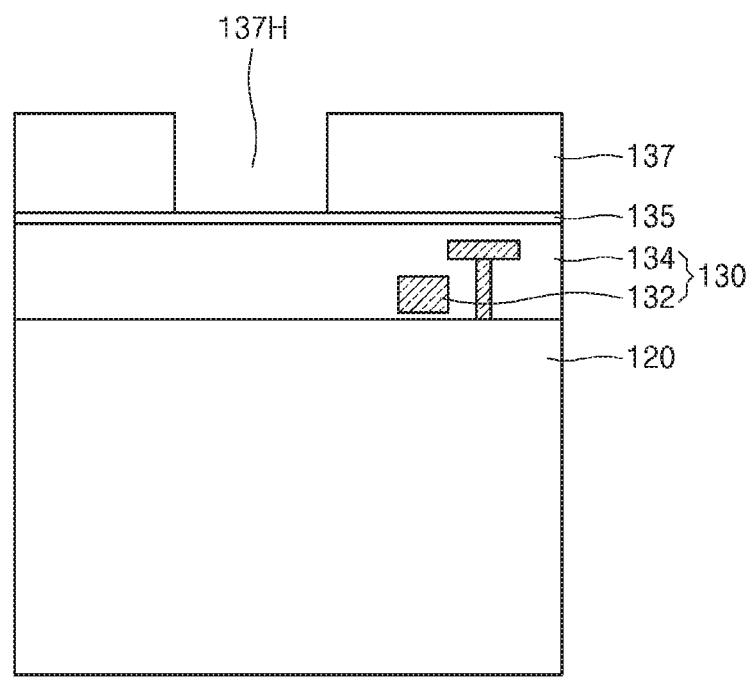
FIGS. 11A to 11O are cross-sectional views illustrating a method of manufacturing an IC device according to an embodiment of the inventive concept in a process order.
Figure 11B:
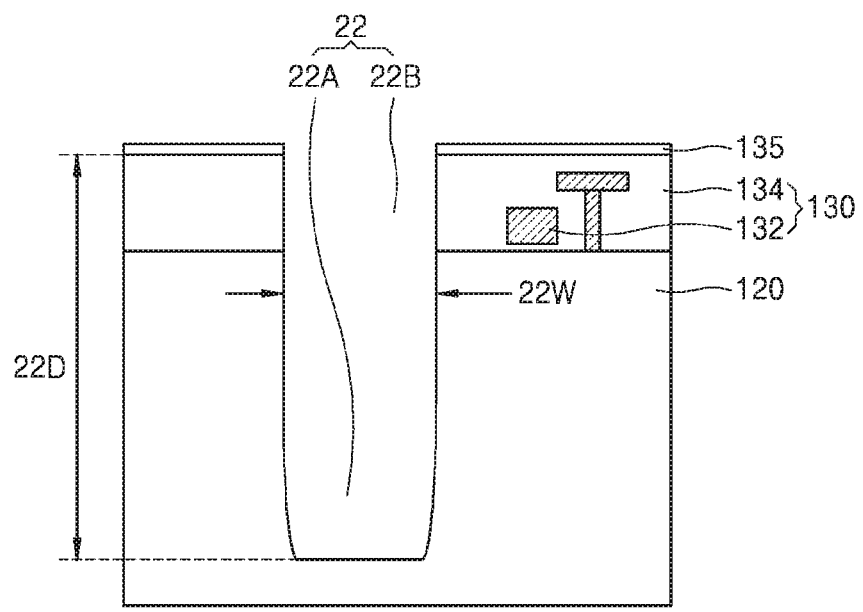
Figure 11C:
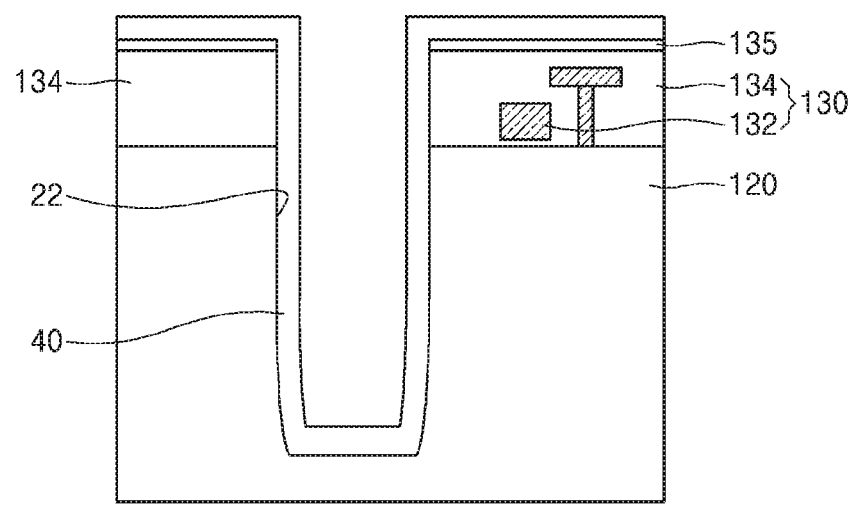
Figure 11D:
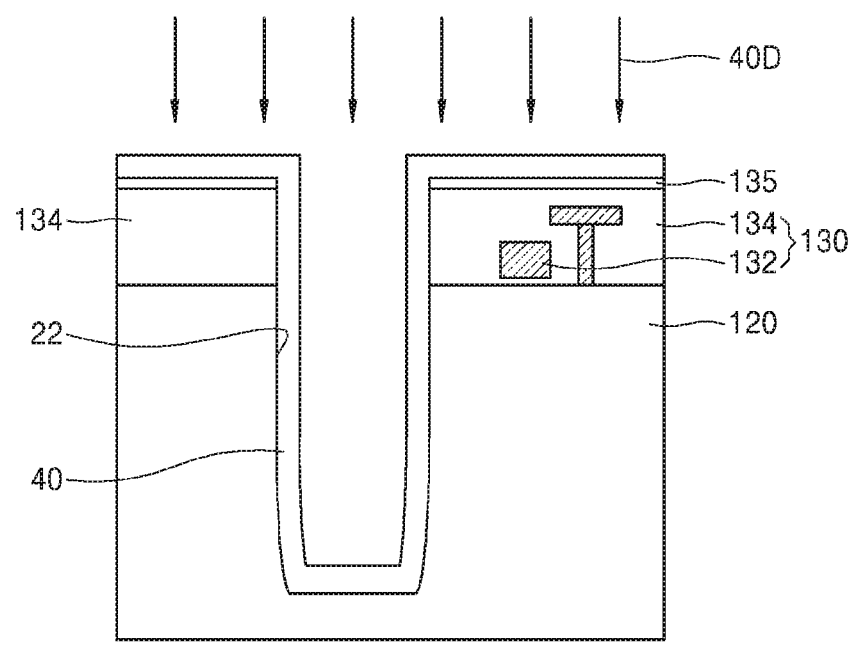
Figure 11E:
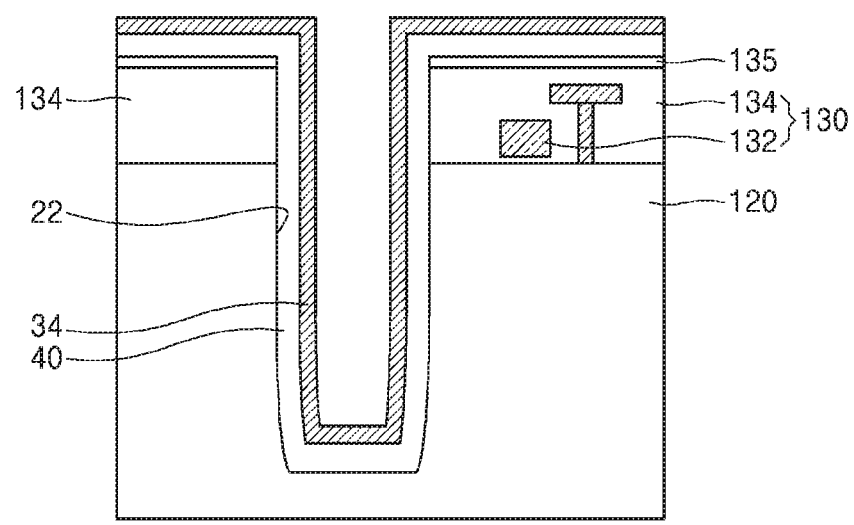
Figure 11F:
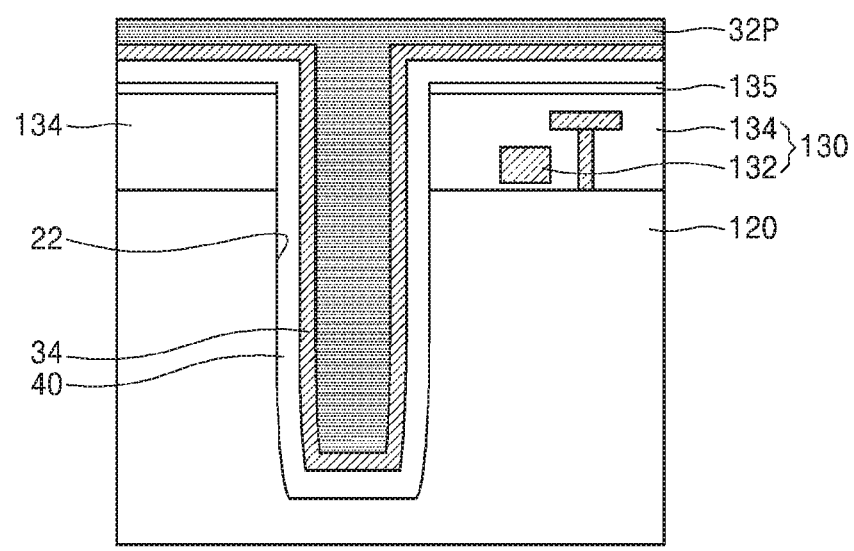
Figure 11G:
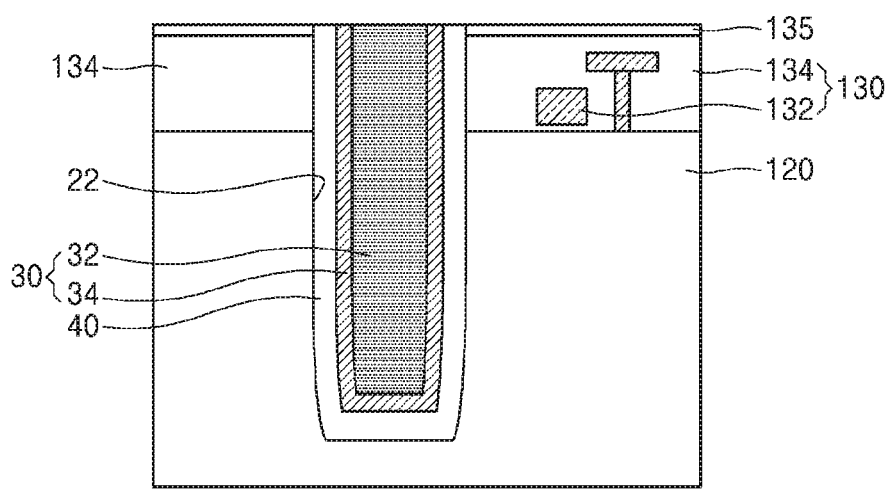
Figure 11H:
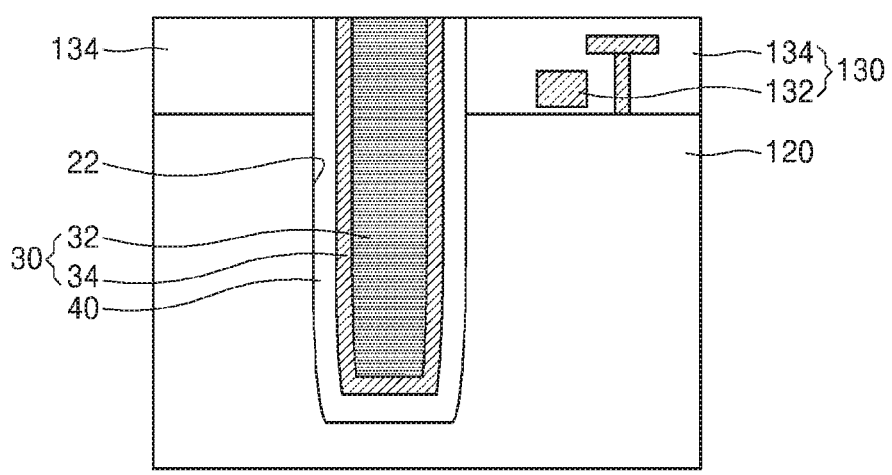
Figure 11I:
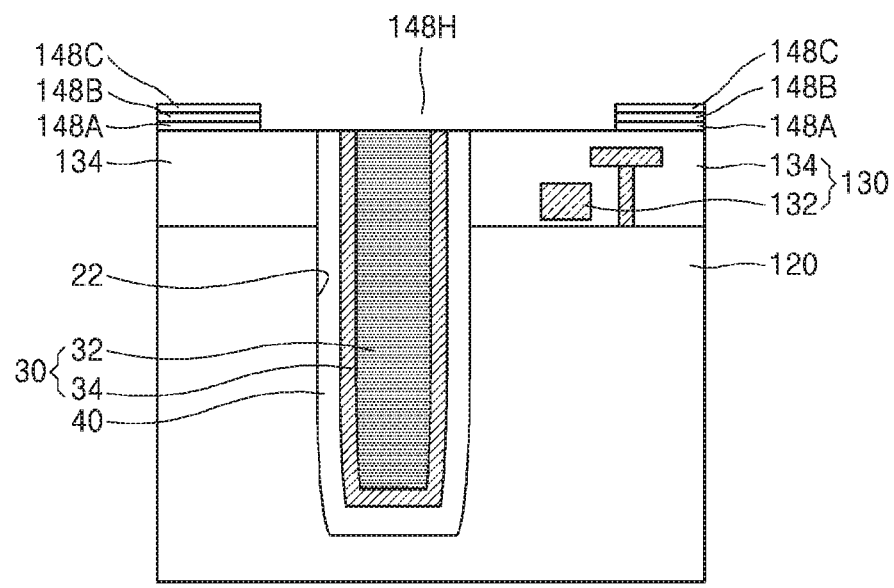
Figure 11J:
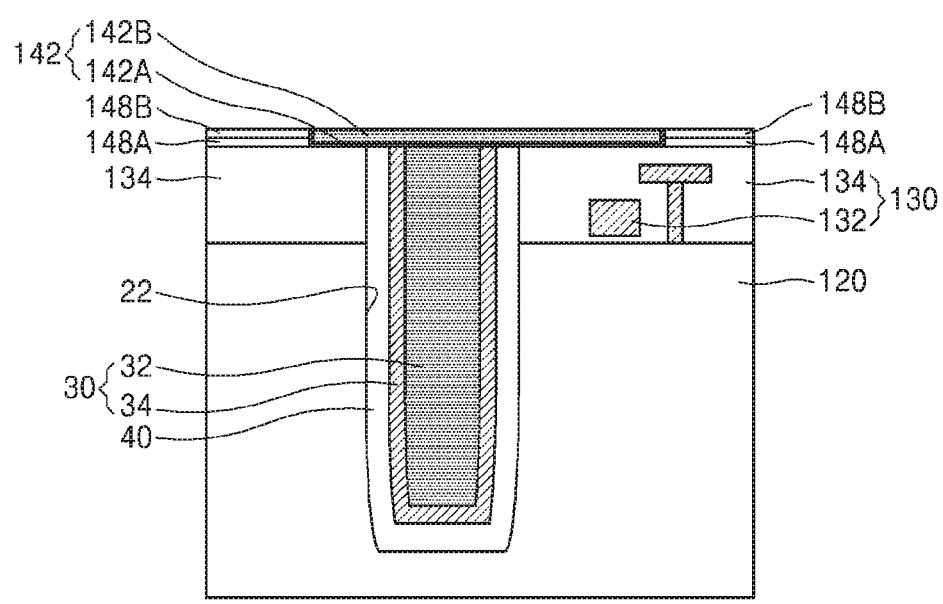
Figure 11K:
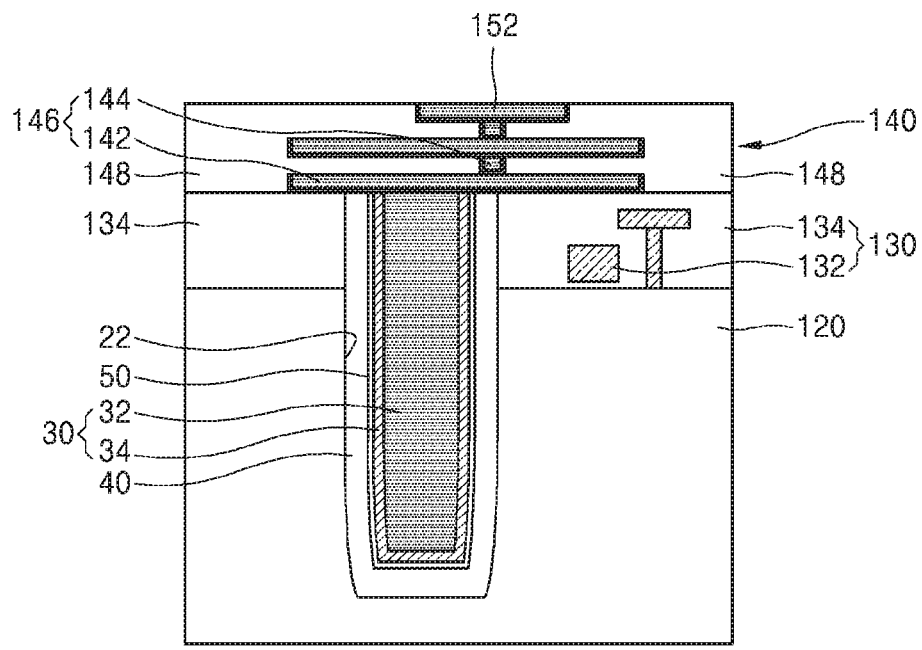
Figure 11L:
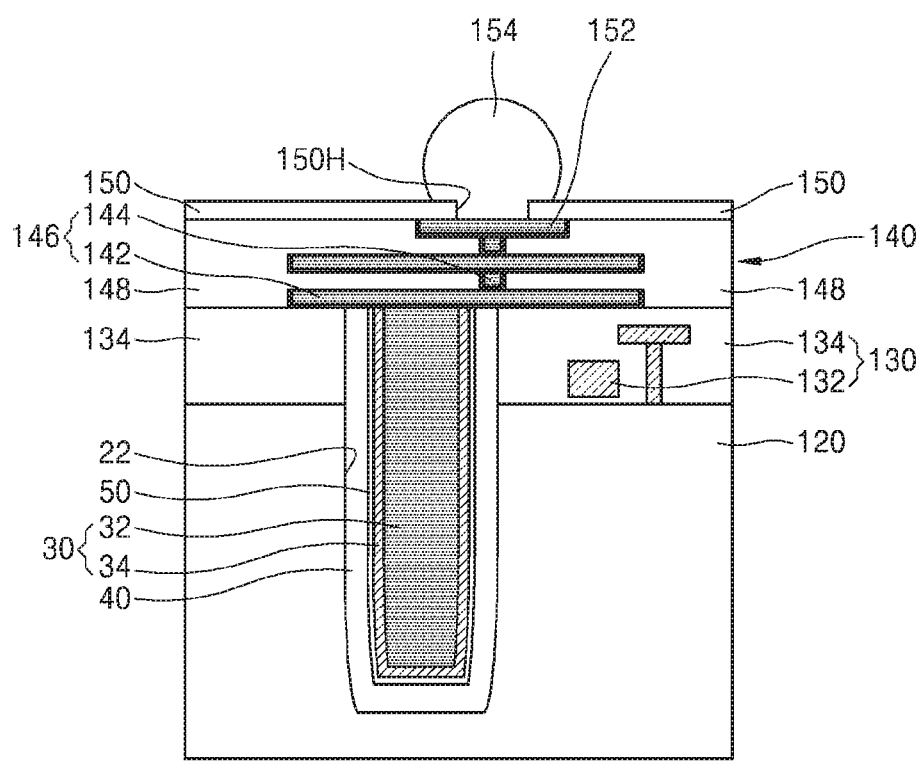
Figure 11M:
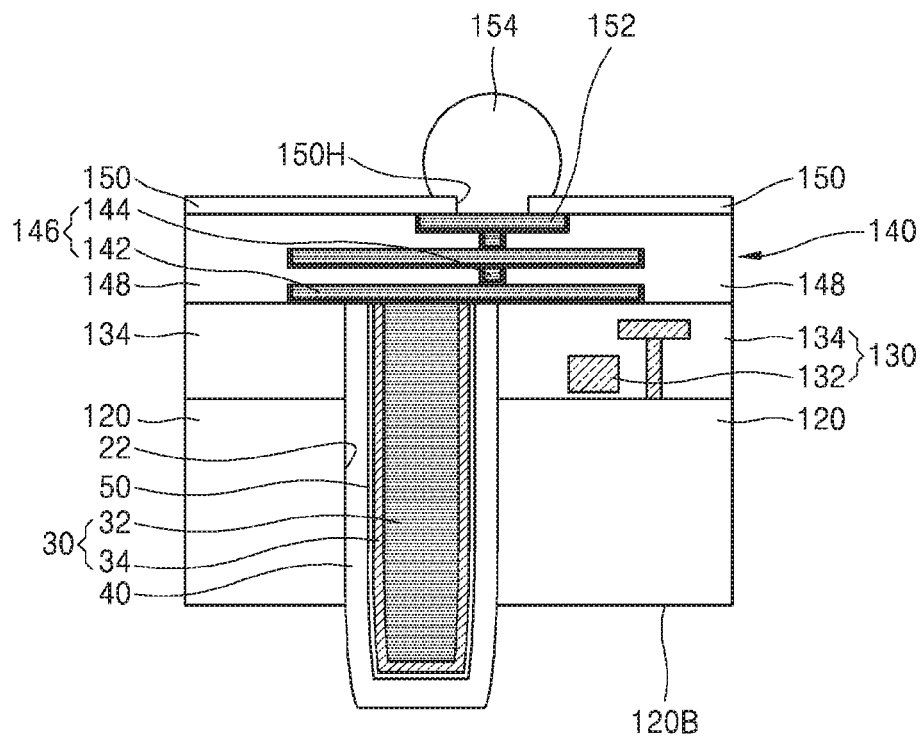
Figure 11N:
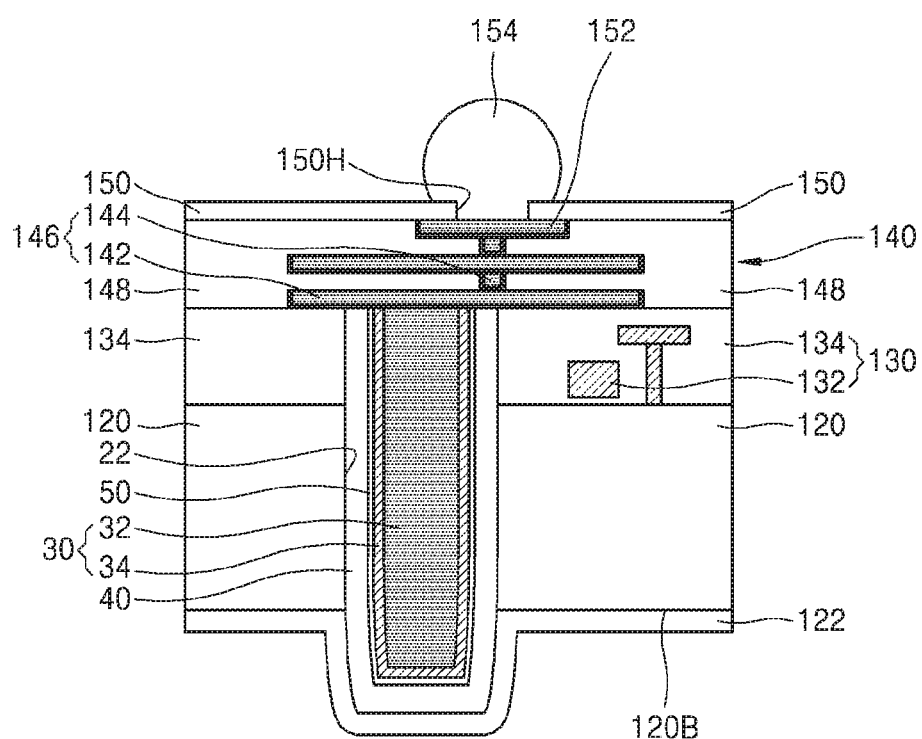
Figure 11O:
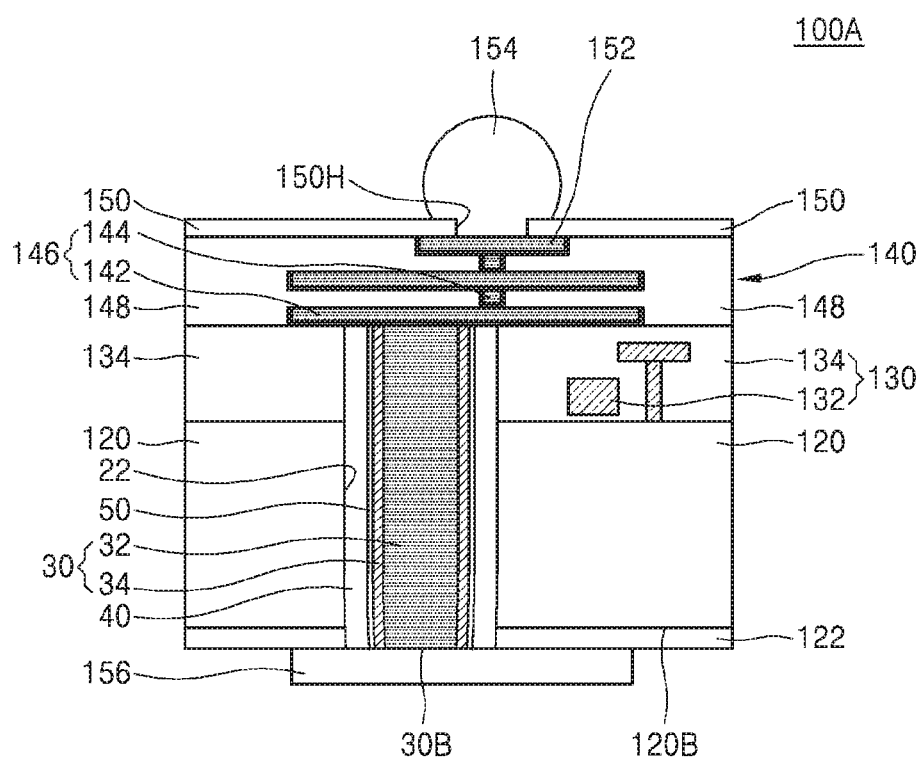

FIGS. 11A to 11O are cross-sectional views illustrating a method of manufacturing the IC device 100A (refer to FIG. 2) according to an embodiment of the inventive concept in a process order. In FIGS. 11A to 11O, the same reference numerals as those of FIGS. 1A to 2 refer to the same elements and detailed descriptions of the elements will not be repeated here.

Referring to FIG. 11A, after forming the FEOL structure 130 on the substrate 120 and forming a first polish stop layer 135 on the FEOL structure 130, a mask pattern 137 may be formed on the first polish stop layer 135. A hole 137H that partially exposes a top surface of the first polish stop layer 135 may be formed in the mask pattern 137.

In some embodiments, the first polish stop layer 135 may be formed of a silicon nitride layer or a silicon oxynitride layer. The first polish stop layer 135 may be formed to have a thickness of about 200 Å to about 1,000 Å. The CVD process may be used for forming the first polish stop layer 135.

The mask pattern 137 may be formed of a photoresist layer.

Referring to FIG. 11B, the first polish stop layer 135 and the interlayer insulating layer 134 are etched using the mask pattern 137 (refer to FIG. 11A) as an etching mask and then, the substrate 120 is etched to form the via hole 22. The via hole 22 includes a first hole 22A formed to have a predetermined depth in the substrate 120 and a second hole 22B formed to pass through the interlayer insulating layer 134 to be connected to the first hole 22A.

An anisotropic etching process may be used for forming the via hole 22. In some embodiments, the via hole 22 may be formed to have a width 22W of about 10 μm or less in the substrate 120. In some embodiments, the via hole 22 may be formed to have a depth 22D of about 50 μm to about 100 μm from a top surface of the interlayer insulating layer 134. However, the width 22W and the depth 22D of the via hole 22 are not limited thereto but may have various measurements as occasion demands. The substrate 120 is exposed through the first hole 22A of the via hole 22 and the interlayer insulating layer 134 is exposed through the second hole 22B of the via hole 22. In some other embodiments, a laser drilling technology may be used for forming the via hole 22.

After the via hole 22 is formed, the mask pattern 137 may be removed to expose the top surface of the first polish stop layer 135.

Referring to FIG. 11C, the via insulating layer 40 that covers an internal side wall and a bottom surface of the via hole 22 is formed.

The via insulating layer 40 may be formed to cover a sidewall surface of the substrate 120 and a sidewall surface of the interlayer insulating layer 134 that are exposed in the via hole 22 and a sidewall surface of the first polish stop layer 135.

Referring to FIG. 11D, heat 40D is applied to a resultant structure in which the via insulating layer 40 is formed so that the degassing process described with reference to the process 326 of FIG. 7 is performed.

In some embodiments, the degassing process may be performed at a temperature of about 300° C. to about 500° C. and under a pressure of about $10^{-3}$ Torr to $10^{-4}$ Torr for about 30 seconds to about 5 minutes.

While performing the degassing process, outgassing for discharging moisture and various impurities undesirably contained in the via insulating layer 40 to the outside may be induced by the heat 40D applied to the via insulating layer 40 and thus, the via insulating layer 40 may be densified.

The degassing chamber 450 of the semiconductor device manufacturing apparatus 400 described with reference to FIGS. 8 and 9 may be used for performing the degassing process. In addition, the temperature controlling method described with reference to FIGS. 10A and 10B may be used for performing the degassing process.

In some embodiments, when the via hole 22 has a high aspect ratio, thermal energy applied to a portion of the via insulating layer 40 close to an entrance of the via hole 22, by the heat 40D during the degassing process, may be different from that applied to a portion of the via insulating layer 40 close to the bottom surface of the via hole 22. For example, more of the heat 40D may be applied to the entrance of the via hole 22 than to the bottom surface of the via hole 22. Therefore, a degree of densification of the portion of the via insulating layer 40 close to the entrance of the via hole 22 may be larger than that of the portion of the via insulating layer 40 close to the bottom surface of the via hole 22. A difference in the degree of densification in accordance with a position of the via insulating layer 40 may be confirmed by an etching amount with respect to an etching solution. For example, an etching amount of the portion of the via insulating layer 40 with the large degree of densification with respect to a hydrofluoric acid (HF) solution may be smaller than that of the portion of the via insulating layer 40 with the small degree of densification with respect to the HF solution. However, the difference in the degree of densification and a difference in the etching amount with respect to the etching solution may be too small to adversely affect characteristics of the IC device. In some embodiments, the degree of densification of the portion of the via insulating layer 40 close to the entrance of the via hole 22 may be the same as or similar to that of the portion of the via insulating layer 40 close to the bottom surface of the via hole 22. Therefore, the etching amount of the portion of the via insulating layer 40 close to the entrance of the via hole 22 with respect to the HF solution may be the same as or similar to that of the portion of the via insulating layer 40 close to the bottom surface of the via hole 22 with respect to the HF solution.

In addition, since the degassing process described with respect to FIG. 11D is performed at a high temperature of about 300° C. to about 500° C., the degree of densification of the via insulating layer 40 obtained by the method of manufacturing the IC device according to the inventive concept is larger than that of another via insulating layer that undergoes a low temperature degassing process performed at a low temperature, for example, at a temperature of about 200° C. Therefore, the etching amount of the via insulating layer 40 with respect to an etching solution such as the HF solution may be smaller than that of the other via insulating layer that undergoes the low temperature degassing process with respect to the etching solution such as the HF solution.

Referring to FIG. 11E, the conductive barrier layer 34 is formed on the via insulating layer 40 in and outside the via hole 22.

The process of forming the conductive barrier layer 34 may be performed while maintaining the vacuum atmosphere of the degassing process after the degassing process described with reference to FIG. 11D. However, the pressure of the degassing process may be different from a pressure under which the conductive barrier layer 34 is formed.

The PVD process or the CVD process may be used for forming the conductive barrier layer 34. The process of forming the conductive barrier layer 34 may be performed in at least one of the plurality of process chambers 420 included in the semiconductor device manufacturing apparatus 400 described with reference to FIG. 8.

In some embodiments, the conductive barrier layer 34 may be a single layer formed of a single material or material type or a multi-layer structure including at least two kinds of materials. In some embodiments, the conductive barrier layer 34 may include at least one material selected from W, WN, WC, Ti, TiN, Ta, TaN, Ru, Co, Mn, Ni, or NiB. For example, the conductive barrier layer 34 may have a lamination structure formed of a TaN layer having a thickness of about 50 Å to about 200 Å and a Ta layer having a thickness of about 1,000 Å to about 3,000 Å.

Referring to FIG. 11F, a metal layer 32P that fills the remaining space of the via hole 22 is formed on the conductive barrier layer 34.

A process of forming the metal layer 32P may be performed while maintaining the vacuum atmosphere in which the conductive barrier layer 34 is formed after the process of forming the conductive barrier layer 34 described with reference to FIG. 11E. However, the pressure under which the conductive barrier layer 34 is formed may be different from that under which the metal layer 32P is formed.

The process of forming the metal layer 32P may be performed in at least one of the plurality of process chambers 420 included in the semiconductor device manufacturing apparatus 400 described with reference to FIG. 8.

The metal layer 32P may be formed to cover the conductive barrier layer 34 in and outside the via hole 22.

In some embodiments, an electroplating process may be used for forming the metal layer 32P. To be specific, after forming a metal seed layer (not shown) on the surface of the conductive barrier layer 34, the metal layer is grown from the metal seed layer by the electroplating process so that the metal layer 32P that fills the via hole 22 is formed on the conductive barrier layer 34. The metal seed layer may be formed of Cu, a Cu alloy, Co, Ni, Ru, Co/Cu, or Ru/Cu. The PVD process may be used for forming the metal seed layer. The metal layer 32P may be mainly formed of Cu or W. In some embodiments, the metal layer 32P may be formed of Cu, CuSn, CuMg, CuNi, CuZn, CuPd, CuAu, CuRe, CuW, W, or a W alloy. However, the inventive concept is not limited thereto. The electroplating process may be performed at a temperature of about 10° C. to about 65° C. For example, the electroplating process may be performed at room temperature. After the metal layer 32P is formed, as occasion demands, the resultant structure in which the metal layer 32P is formed may be annealed at a temperature of about 150° C. to about 450° C.

In some embodiments, the degassing process described with reference to FIG. 11D, the process of forming the conductive barrier layer 34 described with reference to FIG. 11E, and the process of forming the metal layer 32P described with reference to FIG. 11F may be performed without interruption in the semiconductor device manufacturing apparatus 400 illustrated in FIG. 8 while maintaining the vacuum atmosphere without vacuum break.

Referring to FIG. 11G, the resultant structure of FIG. 11F including the metal layer 32P may be polished by a chemical mechanical polishing (CMP) process using the first polish stop layer 135 as a stopper to expose the first polish stop layer 135.

As a result, parts of the via insulating layer 40, the conductive barrier layer 34, and the metal layer 32P outside of the via hole 22 are removed and the conductive plug 32 that is a part of the metal layer 32P is left on the conductive barrier layer 34 in the via hole 22.

Referring to FIG. 11H, a resultant structure in which the conductive plug 32 is formed in the via hole 22 is thermally processed. As a result, metal particles that form the conductive plug 32 are grown by the thermal processing and thus, the exposed surface of the conductive plug 32 may become rougher. Among the metal particles grown by the thermal processing, parts that protrude outside of the via hole 22 are removed by the CMP process. At this time, the first polish stop layer 135 (refer to FIG. 11G) is also removed so that the top surface of the interlayer insulating layer 134 of the FEOL structure 130 may be exposed to the outside. In some embodiments, the thermal processing may be performed at a temperature of about 400° C. to about 500° C.

The TSV structure 30 formed of the conductive plug 32 and the conductive barrier layer 34 that substantially surrounds the conductive plug 32 is left in the via hole 22.

Referring to FIG. 11I, after cleaning the resultant material of FIG. 11H that includes the TSV structure 30, a second polish stop layer 148A, an insulating layer 148B, and a third polish stop layer 148C are sequentially formed on the interlayer insulating layer 134 and are patterned to form a metal wiring hole 148H that exposes the top surface of the TSV structure 30 at the entrance of the via hole 22 and a periphery of the top surface of the TSV structure 30.

The second polish stop layer 148A may be used as an etching stopper when the metal wiring hole 148H is formed.

Through the metal wiring hole 148H, portions of the TSV structure 30, the via insulating layer 40, and the interlayer insulating layer 134 may be exposed. In some embodiments, the metal wiring hole 148H may be formed so that only the top surface of the TSV structure 30 is exposed through the metal wiring hole 148H.

In some embodiments, the insulating layer 148B may be formed of tetra-ethyl-ortho-silicate (TEOS). The second polish stop layer 148A and the third polish stop layer 148C may be formed of a silicon nitride layer or a silicon oxynitride layer. Thicknesses of the second polish stop layer 148A, the insulating layer 148B, and the third polish stop layer 148C may be determined depending on the applications.

Referring to FIG. 11J, the metal wiring layer 142 is formed in the metal wiring hole 148H.

The metal wiring layer 142 may have a structure in which a wiring barrier layer 142A and a wiring metal layer 142B are sequentially laminated.

In some embodiments, to form the metal wiring layer 142, after sequentially forming a first layer for forming the wiring barrier layer 142A and a second layer for forming the wiring metal layer 142B in the metal wiring hole 148H and on the third polish stop layer 148C (refer to FIG. 11I), a resultant structure, in which the first and second layers are formed, is polished by the CMP process using the third polish stop layer 148C as a stopper. While the CMP process is performed, the third polish stop layer 148C is removed so that a top surface of the insulating layer 148B may be exposed. As a result, the metal wiring layer 142 formed of the wiring barrier layer 142A and the wiring metal layer 142B is left in the metal wiring hole 148H.

In some embodiments, the wiring barrier layer 142A may include at least one material selected from Ti, TiN, Ta, or TaN. In some embodiments, the PVD process may be used for forming the wiring barrier layer 142A. The wiring barrier layer 142A may be formed to have a thickness of about 1,000 Å to about 1,500 Å.

In some embodiments, the wiring metal layer 142B may include Cu. In order to form the wiring metal layer 142B, after forming a Cu seed layer on a surface of the wiring barrier layer 142A, a process of growing a Cu layer from the Cu seed layer by an electroplating process and annealing a resultant structure in which the Cu layer is formed may be performed.

Referring to FIG. 11K, the contact plug 144 having the same lamination structure as that of the metal wiring layer 142 is formed on the metal wiring layer 142 by a similar method to that of the process of forming the metal wiring layer 142 described with reference to FIGS. 11I and 11J. Then, the process of forming the metal wiring layer 142 described with reference to FIGS. 11I and 11J and the above-described process of forming the contact plug 144 are alternately performed a plurality of times so that the multilayer wiring structure 146, to which the plurality of metal wiring layers 142 and the plurality of contact plugs 144 are alternately connected one by one, and the bonding pad 152 connected to the multilayer wiring structure 146 are formed.

In the present example, it is illustrated that the multilayer wiring structure 146 includes the two metal wiring layers 142 and the two contact plugs 144 for descriptive convenience. However, the inventive concept is not limited thereto. In addition, in the multilayer wiring structure 146 illustrated in FIG. 11K, the connection structure between the metal wiring layer 142 and the contact plug 144 is only exemplary and the inventive concept is not limited to the structure illustrated in FIG. 11K.

In some embodiments, the plurality of metal wiring layers 142 and the plurality of contact plugs 144 may include at least one metal selected from W, aluminium (Al), or Cu. In some embodiments, the plurality of metal wiring layers 142 and the plurality of contact plugs 144 may be formed of the same material. In some embodiments, at least parts of the plurality of metal wiring layers 142 and the plurality of contact plugs 144 may be formed to include different materials.

In some embodiments, when the multilayer wiring structure 146 is formed, in other regions on the substrate 120, other multilayer wiring structures (not shown) including metal wiring layers and contact plugs simultaneously formed with at least parts selected from the plurality of metal wiring layers 142 and the plurality of contact plugs 144 may be formed. As a result, on the FEOL structure 130, the BEOL structure 140, including the metal interlayer insulating layer 148 formed of the plurality of second polish stop layers 148A and the plurality of insulating layers 148B (refer to FIG. 11J) and a plurality of multilayer wiring structures including parts insulated by the metal interlayer insulating layer 148, is formed. The BEOL structure 140 may be formed to include a plurality of wiring structures for connecting the individual devices included in the FEOL structure 130 to other wiring lines formed on the substrate 120. In some embodiments, the BEOL structure 140 may be formed to further include a seal ring for protecting the wiring structures and other structures thereunder against external shock or moisture.

The tiny amounts of moisture and impurities that reside in the via insulating layer 40 may be outgassed while undergoing the thermal process performed while the BEOL structure 140 is formed. However, after forming the via insulating layer 40, and before forming the TSV structure 30, as described with reference to FIG. 11D, since the thermal processing is performed on the via insulating layer 40 at an optimal degassing temperature, for example, at a temperature in a range of about 300° C. to about 500° C., so that most of moisture and impurities are previously outgassed through the degassing process, only tiny amounts of moisture and impurities that may reside in the via insulating layer 40 are outgassed during the thermal process performed while the BEOL structure 140 is formed so that only a portion of the conductive barrier layer 34 is oxidized at the interface between the conductive barrier layer 34 of the TSV structure 30 and the via insulating layer 40. As a result, the metal-containing insulating layer 50 having a very small thickness, for example, a thickness of about 2 Å to about 50 Å, which does not have an adverse effect on a function of the TSV structure 30, may be formed at the interface between the conductive barrier layer 34 and the via insulating layer 40.

Referring to FIG. 11L, after forming the upper insulating layer 150 in which the hole 150H that exposes the bonding pad 152 is formed on the BEOL structure 140, the upper contact terminal 154 connected to the bonding pad 152 through the hole 150H is formed on the upper insulating layer 150.

In some embodiments, the upper insulating layer 150 may be formed of a silicon oxide layer, a silicon nitride layer, polymer, or a combination thereof.

In some embodiments, a thermal process may be performed while forming the upper contact terminal 154. When the metal-containing insulating layer 50 is not formed during the process of forming the BEOL structure 140 described with reference to FIG. 11K, the metal-containing insulating layer 50 may be formed by the thermal process performed while forming the upper contact terminal 154. At this time, like as described with reference to FIG. 11K, after forming the via insulating layer 40, and before forming the TSV structure 30, as described with reference to FIG. 11D, since the thermal processing is performed on the via insulating layer 40 at an optimal degassing temperature, for example, at a temperature in a range of about 300° C. to about 500° C., so that most of moisture and impurities are previously outgassed through the degassing process, only tiny amounts of moisture and impurities that may reside in the via insulating layer 40 are outgassed during the thermal process performed while the upper contact terminal 154 is formed so that only a portion of the conductive barrier layer 34 is oxidized at the interface between the conductive barrier layer 34 of the TSV structure 30 and the via insulating layer 40. As a result, the metal-containing insulating layer 50 having a very small thickness, for example, a thickness of about 2 Å to about 50 Å, which does not have an adverse effect on a function of the TSV structure 30, may be formed at the interface between the conductive barrier layer 34 and the via insulating layer 40.

Referring to FIG. 11M, a portion of the substrate 120 is removed from the bottom surface thereof so that the TSV structure 30 surrounded by the via insulating layer 40 protrudes from the bottom surface 120B of the substrate 120.

Referring to FIG. 11N, the lower insulating layer 122 that covers the bottom surface 120B of the substrate 120 is formed.

The lower insulating layer 122 may be formed to cover the via insulating layer 140 that protrudes from the bottom surface 120B of the substrate 120.

In some embodiments, the lower insulating layer 122 may be formed by the CVD process. In some embodiments, the lower insulating layer 122 may be formed of a silicon oxide layer, a silicon nitride layer, or polymer.

Referring to FIG. 11O, a polishing process is performed on the exposed surface of the lower insulating layer 122 until a planarized surface is obtained in the bottom surface 120B of the substrate 120 so that the planarized bottom surface 30B of the TSV structure 30 is exposed through the bottom surface 120B of the substrate 120.

Then, a thermal process may be performed while forming the lower contact terminal 156.

In some embodiments, unlike as described with reference to FIGS. 11K and 11L, the metal-containing insulating layer 50 formed between the via insulating layer 40 and the conductive barrier layer 34 may not be formed during the process of forming the BEOL structure 140 described with reference to FIG. 11K and the process of forming the upper contact terminal 154 described with reference to FIG. 11L. In this case, the metal-containing insulating layer 50 may be formed by the thermal process performed while forming the lower contact terminal 156. At this time, like as described with reference to FIGS. 11K and 11L, after forming the via insulating layer 40, and before forming the TSV structure 30, as described with reference to FIG. 11D, since the thermal processing is performed on the via insulating layer 40 at an optimal degassing temperature, for example, at a temperature in a range of about 300° C. to about 500° C. so that most of moisture and impurities are previously outgassed through the degassing process, only very small amounts of moisture and impurities that may reside in the via insulating layer 40 are outgassed during the thermal process performed while the lower contact terminal 156 is formed and thus, only a portion of the conductive barrier layer 34 is oxidized at the interface between the conductive barrier layer 34 of the TSV structure 30 and the via insulating layer 40. As a result, the metal-containing insulating layer 50 having a very small thickness, for example, a thickness of about 2 Å to about 50 Å, which does not have an adverse effect on a function of the TSV structure 30, may be formed at the interface between the conductive barrier layer 34 and the via insulating layer 40.

Referring to FIGS. 11A to 11O, an exemplary method of manufacturing the IC device 100A illustrated in FIG. 2 is described. However, it is well known to those of ordinary skill in the art that the IC device 100B illustrated in FIG. 3 and the IC device 100C illustrated in FIG. 4 may be easily manufactured by the manufacturing method described with reference to FIGS. 11A and 11O according to the inventive concept.

In the method of manufacturing an IC device according to the inventive concept, after forming the via insulating layer 40, the degassing process is performed under an optimized condition so that outgassing may be sufficiently performed from the via insulating layer 40 and thus, the densified via insulating layer 40 is formed. Then, the TSV structure 30 is formed on the via insulating layer 40 that undergoes the optimized degassing process. Therefore, although the subsequent process accompanied by the thermal process is performed after the TSV structure 30 is formed, outgassing from the via insulating layer, which is caused by thermal stress, is minimized. Therefore, it is possible to prevent an oxide such as $TaO_x$ and $CuO_x$ from being formed at an interface between the conductive barrier layer and the conductive plug and to prevent delamination from occurring due to outgassing in the interface between the conductive barrier layer and the conductive plug that form the TSV structure, and thus, an adhesive force between the conductive barrier layer and the conductive plug may be enhanced and reliability of the TSV structure may be improved.

FIGS. 12A to 16 are graphs illustrating thermo desorption system (TDS) analysis results of evaluating outgassing effects under temperature conditions during a degassing process performed on a via insulating layer in a method of manufacturing an IC device according to the inventive concept. FIG. 12B illustrates the results of FIG. 12A displayed as differential values.

To obtain the TDS analysis results illustrated in FIGS. 12A to 16, degassing processes are performed on layers obtained by forming high-aspect ratio process (HARP) layers that may be used for forming the via insulating layer included in the IC device according to the inventive concept on the substrate to a thickness of about 2,000 Å at temperatures of 200° C., 325° C., and 375° C. for about two minutes, respectively. Each of the degassing processes includes an outgassing process performed for about one minute and a purging process performed for about one minute.

Figure 12A:
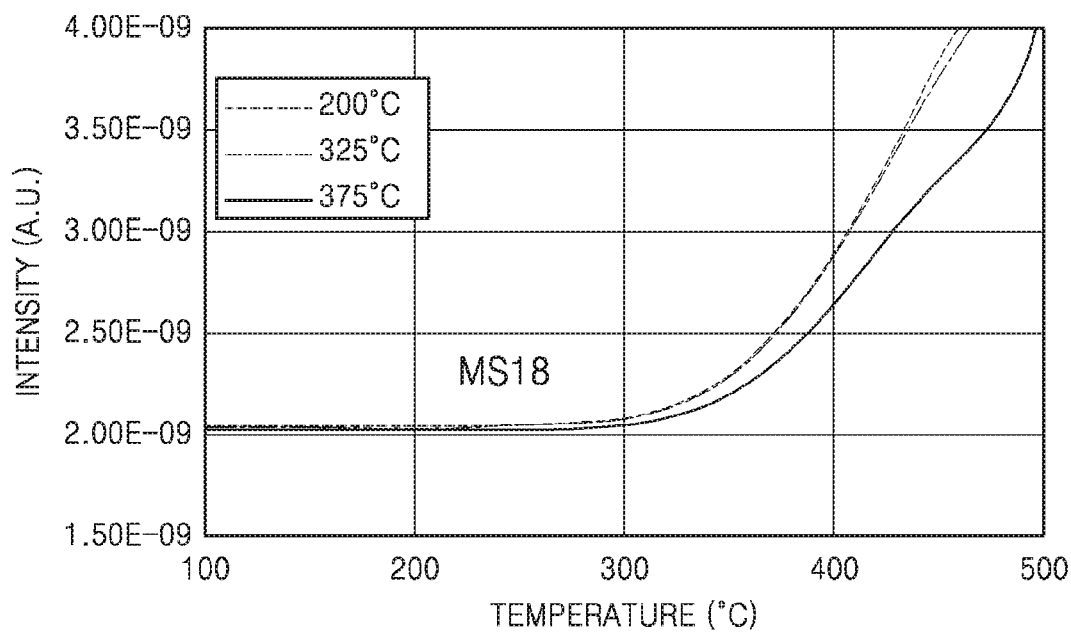
FIGS. 12A to 16 are graphs illustrating thermo desorption system (TDS) analysis results of evaluating outgassing effects under temperature conditions during a degassing process performed on a via insulating layer in a method of manufacturing an IC device according to an embodiment of the inventive concepts.
Figure 12B:
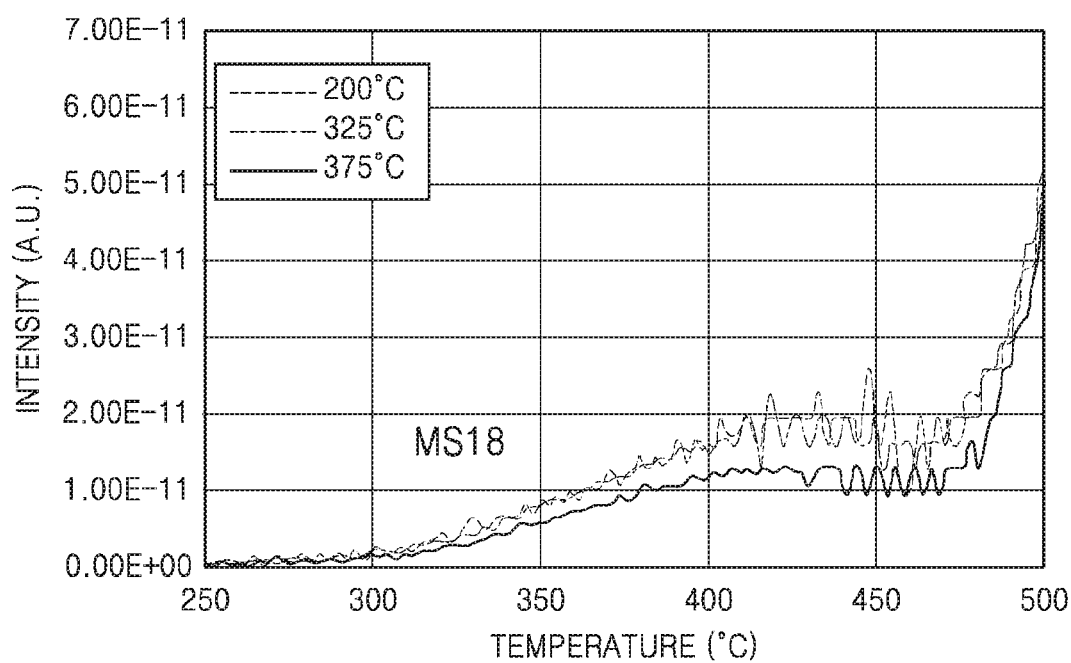

FIGS. 12A and 12B illustrate results of measuring outgassing of a gas whose mass is 18 (MS 18) such as an $OH_x$ component and an $NH_x$ component including $H_2O$, through the TDS analysis with respect to the HARP layers that undergo the degassing processes at the above-described various temperatures. FIG. 12 shows differential values of the results of FIG. 12A.

It is noted from the results of FIGS. 12A and 12B that the amount of outgassing is smallest when the degassing process is performed at the temperature of 375° C. so that an outgassing effect is more optimal when the degassing process is performed at the temperature of 375° C.

Figure 13:
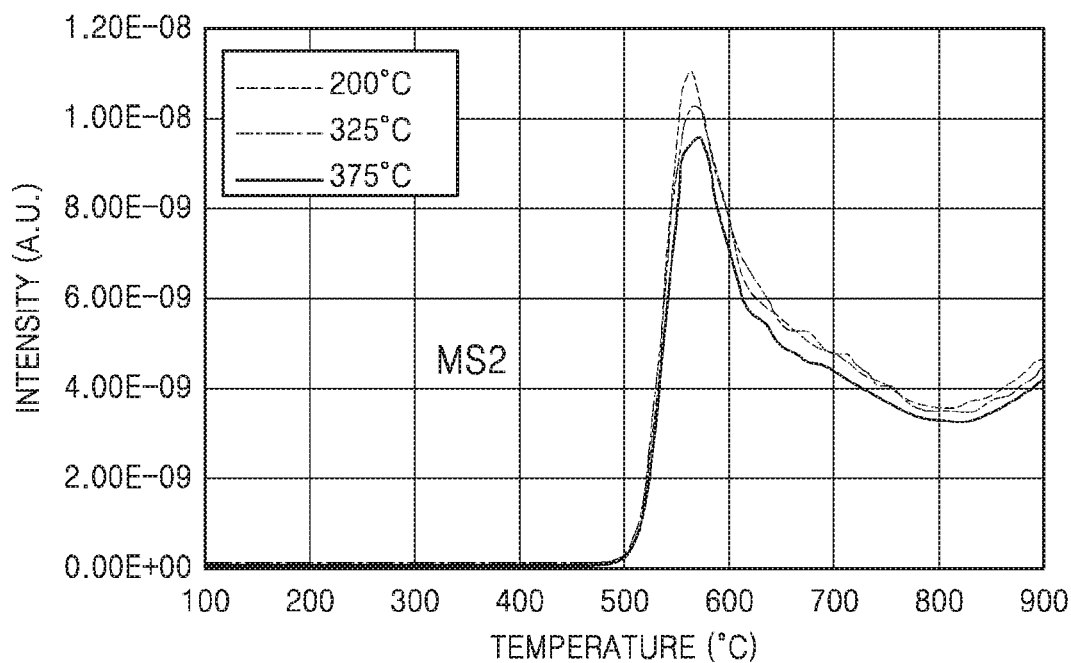

FIG. 13 illustrates results of measuring outgassing of a gas whose mass is 2 (MS 2) such as $H_2$, through the TDS analysis with respect to the HARP layers that undergo the degassing processes at the above-described various temperatures.

Figure 14:
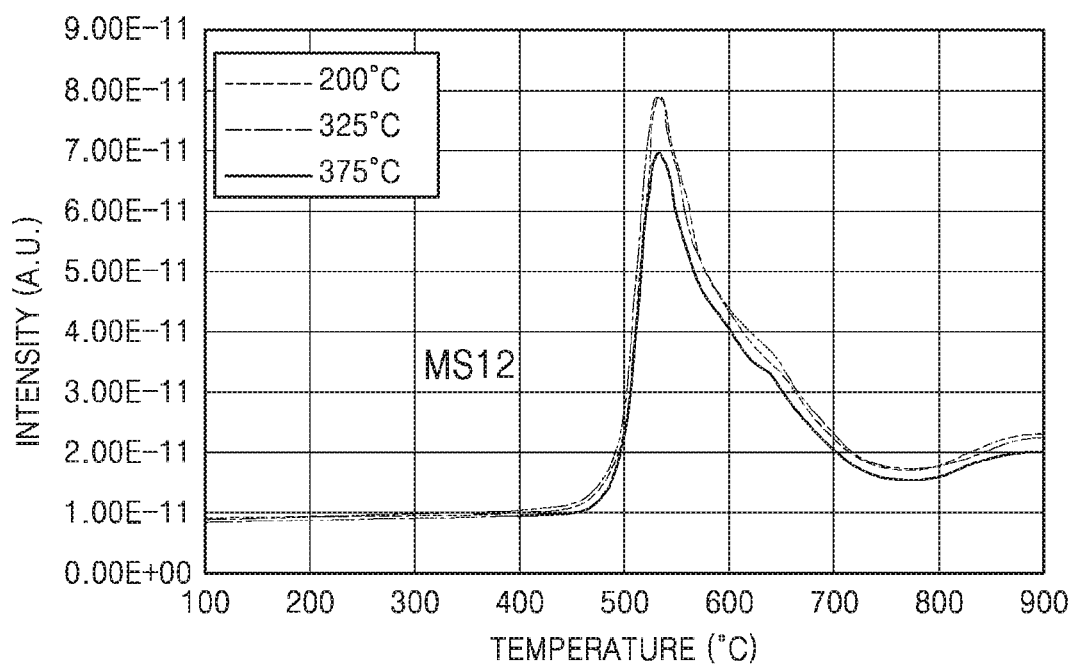

FIG. 14 illustrates results of measuring outgassing of a gas whose mass is 12 (MS 12) such as C, through the TDS analysis with respect to the HARP layers that undergo the degassing processes at the above-described various temperatures.

Figure 15:
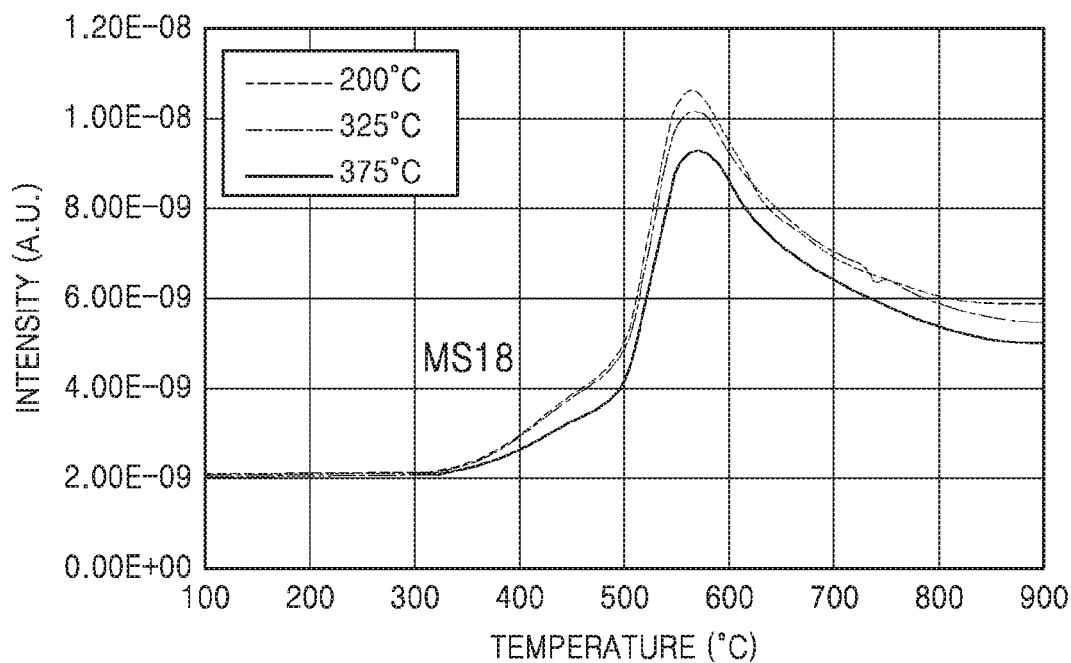

FIG. 15 illustrates results of measuring outgassing of a gas whose mass is 18 (MS 18) such as $OH_x$ and $NH_x$, through the TDS analysis with respect to the HARP layers that undergo the degassing processes at the above-described various temperatures. FIG. 15 includes the results of FIGS. 12A and 12B and illustrates results obtained through a larger temperature range than that of FIGS. 12A and 12B.

Figure 16:
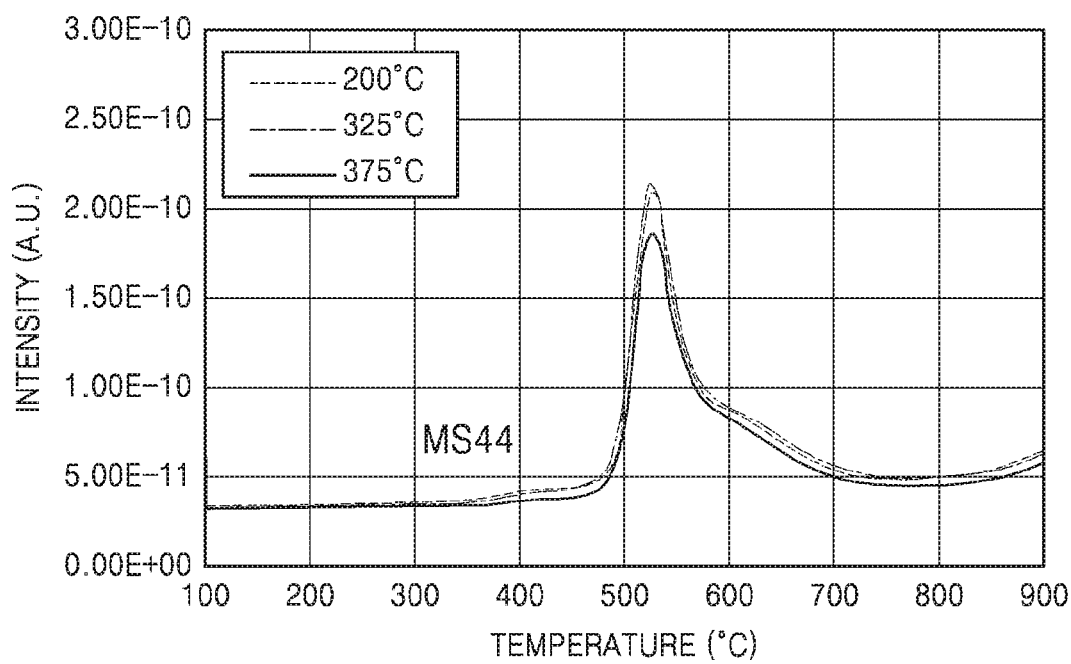

FIG. 16 illustrates results of measuring outgassing of a gas whose mass is 44 (MS 44) such as $CO_x$ and $C_xH_y$, through the TDS analysis with respect to the HARP layers that undergo the degassing processes at the above-described various temperatures.

It is noted from the results of FIGS. 13 to 16 that the amount of outgassing is reduced when the degassing process is performed at the temperature of 375° C. so that the outgassing effect is more optimal when the degassing process is performed at the temperature of 375° C.

Figure 17:
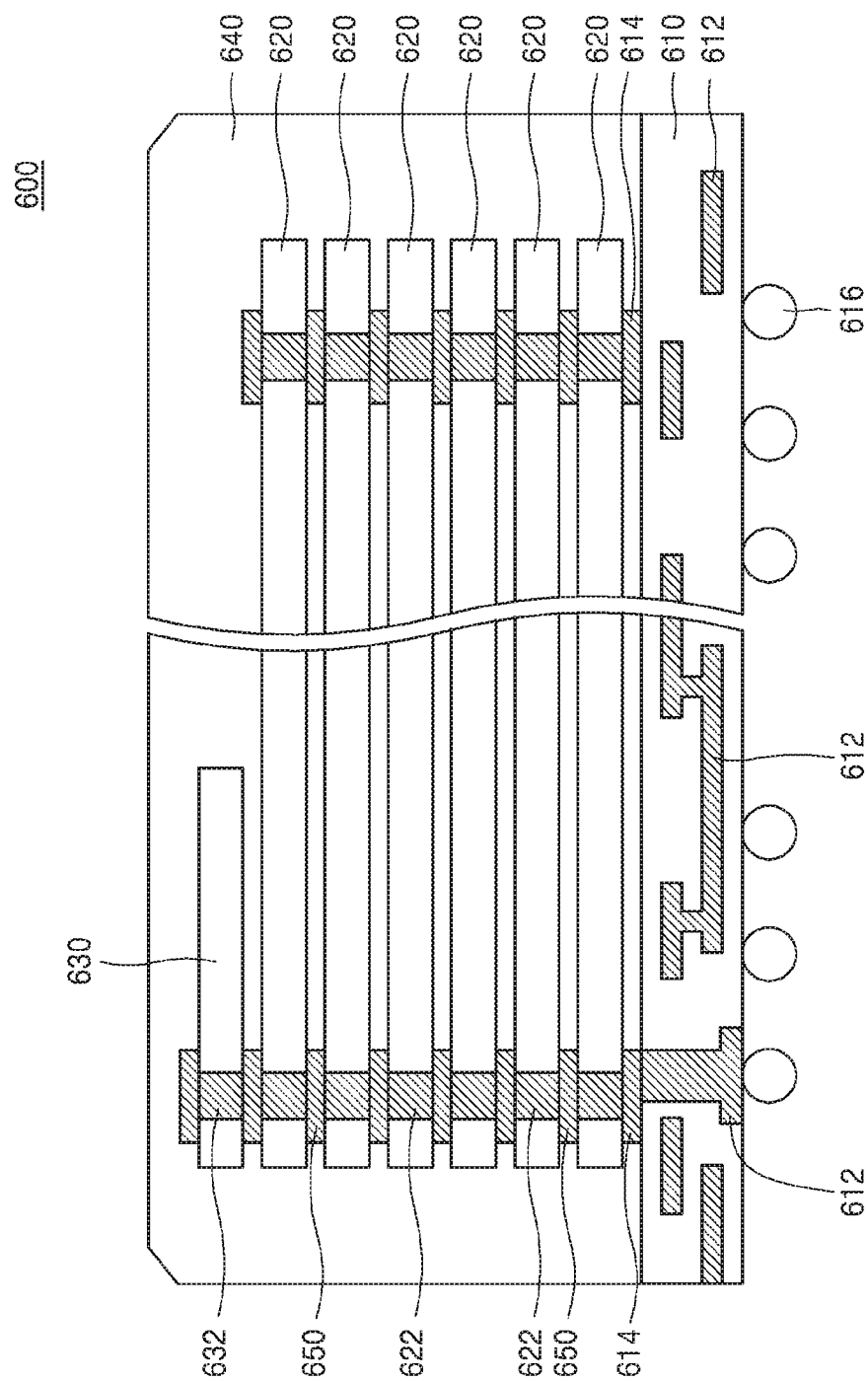
FIG. 17 is a cross-sectional view illustrating elements of a semiconductor package according to an embodiment of the inventive concepts.

FIG. 17 is a cross-sectional view illustrating elements of a semiconductor package 600 according to an embodiment of the inventive concept.

Referring to FIG. 17, the semiconductor package 600 includes a plurality of semiconductor chips 620 sequentially laminated on a package substrate 610. A control chip 630 is connected onto the plurality of semiconductor chips 620. A lamination structure of the plurality of semiconductor chips 620 and the control chip 630 is encapsulated on the package substrate 610 by an encapsulant 640 such as a thermosetting resin. In FIG. 17, a structure in which the six semiconductor chips 620 are vertically laminated is illustrated. However, the number of semiconductor chips 620 and a lamination direction of the semiconductor chips 620 are not limited thereto. The number of semiconductor chips 620 may be determined to be smaller or larger than 6. The plurality of semiconductor chips 620 may be horizontally arranged on the package substrate 610 and may be arranged in a connection structure in which vertical mounting and horizontal mounting are combined. In some embodiments, the control chip 630 may be omitted.

The package substrate 610 may be formed of a flexible PCB, a rigid PCB, or a combination thereof. The package substrate 610 includes substrate internal wiring lines 612 and contact terminals 614. The contact terminals 614 may be formed on one surface of the package substrate 610. Solder balls 616 are formed on another surface of the package substrate 610. The contact terminals 614 are electrically connected to the solder balls 616 through the substrate internal wiring lines 612. In some embodiments, the solder balls 616 may be replaced by conductive bumps or lead grid arrays (LGA).

The plurality of semiconductor chips 620 and the control chip 630 include TSV units 622 and 632. Each of the TSV units 622 and 632 includes the TSV structure 30, the via insulating layer 40, and the metal-containing insulating layer 50 interposed between the conductive barrier layer 34 of the TSV structure 30 and the via insulating layer 40, which are described with reference to FIGS. 1A to 4.

The TSV units 622 and 632 may be electrically connected to the contact terminals 614 of the package substrate 610 by connection members 650 such as bumps. In some embodiments, the TSV unit 632 may be omitted from the control chip 630.

At least one of the plurality of semiconductor chips 620 and the control chip 630 includes at least one of the IC devices 10A, 100A, 100B, and 100C described with reference to FIGS. 1A to 4.

Each of the plurality of semiconductor chips 620 may include a large scale integration (LSI) system, a flash memory, a dynamic random-access memory (DRAM), a static random-access memory (SRAM), an electrically erasable programmable read-only memory (EEPROM), a programmable RAM (PRAM), a magnetic RAM (MRAM), or a resistive RAM (RRAM). The control chip 630 may include logic circuits such as a serializer/deserializer (SER/DES).

Figure 18:
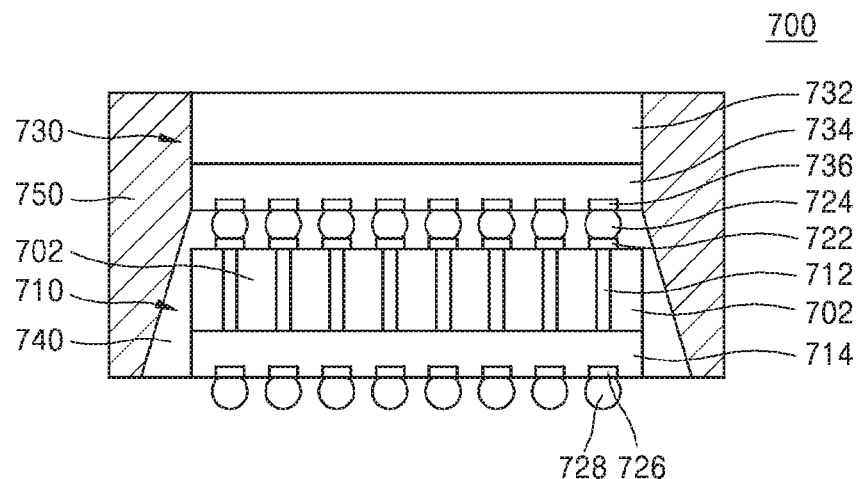
FIG. 18 is a cross-sectional view illustrating a semiconductor package according to an embodiment of the inventive concepts.

FIG. 18 is a cross-sectional view illustrating a semiconductor package according to an embodiment of the inventive concept.

Referring to FIG. 18, a semiconductor package 700 according to the present embodiment may include a first chip 710, a second chip 730, an underfill 740, and an encapsulant 750.

The first chip 710 may have one of the structures of the IC devices 10A, 100A, 100B, and 100C described with reference to FIGS. 1A to 4.

The first chip 710 includes a plurality of TSV units 712 that pass through a semiconductor structure 702. Each of the TSV units 712 includes the TSV structure 30, the via insulating layer 40, and the metal-containing insulating layer 50 interposed between the conductive barrier layer 34 of the TSV structure 30 and the via insulating layer 40, which are described with reference to FIGS. 1A to 4.

The semiconductor structure 702 may include the semiconductor structure 20 illustrated in FIG. 1A or the substrate 120 illustrated in FIGS. 2 to 4.

In some embodiments, the first chip 710 may have the same structure as that of the IC device 100A illustrated in FIG. 2 and a device layer 714 of the first chip 710 may correspond to the BEOL structure 140 illustrated in FIG. 2. In other embodiments, the first chip 710 may have the same structure as that of the IC device 100C illustrated in FIG. 4 and the device layer 714 may correspond to the lamination structure of the FEOL structure 130 and the BEOL structure 140 illustrated in FIG. 4. In other embodiments, the first chip 710 may have the same structure as that of the IC device 100B illustrated in FIG. 3 and the device layer 714 may be omitted.

Upper pads 722 and contact terminals 724 connected to one end of each of the plurality of TSV units 712 may be arranged on one side of the first chip 710. In addition, electrode pads 726 and contact terminals 728 may be connected to the other side of the first chip 710. The contact terminals 724 and 728 may be formed of solder balls or bumps.

The second chip 730 may include a substrate 732 and a wiring structure 734 formed on the substrate 732. An IC layer may be further formed on the substrate 732. The second chip 730 may not include the TSV structure. An electrode pad 736 is connected to the wiring structure 734. The wiring structure 734 may be connected to the TSV units 712 through the electrode pads 736, the contact terminals 724, and the upper pads 722.

The underfill 740 may fill a connection part between the first chip 710 and the second chip 730, that is, a part in which the contact terminals 724 of the first chip 710 are connected to the electrode pads 736 of the second chip 730. The underfill 740 may be formed of epoxy resin and may include a silica filler and a flux. The underfill 740 may be formed of a different material from that of the encapsulant 750 formed outside the underfill 740 or the same material as that of the encapsulant 750 formed outside the underfill 740.

The underfill 740 is formed to surround the connection part between the first chip 710 and the second chip 730 and a side surface of the first chip so that the side surface of the first chip 710 may be encapsulated by the underfill 740.

In FIG. 18, the underfill 740 is wider toward a lower part. However, the shape of the underfill 740 is not limited thereto and the underfill 740 may have various shapes. For example, the underfill 740 may not surround the side surface of the first chip 710 but may be formed only in a space between the first chip 710 and the second chip 730.

The encapsulant 750 encapsulates the first chip 710 and the second chip 730. The encapsulant 750 may be formed of polymer. For example, the encapsulant 750 may be formed of epoxy molding compound (EMC). The encapsulant 750 may encapsulate side surfaces of the second chip 730 and the underfill 740, respectively. In some embodiments, when the underfill 740 is formed only in the space between the first chip 710 and the second chip 730, the encapsulant 750 may encapsulate the side surface of the first chip 710.

A top surface of the second chip 730 may not be encapsulated by the encapsulant 750 to be exposed to the outside.

Figure 19:
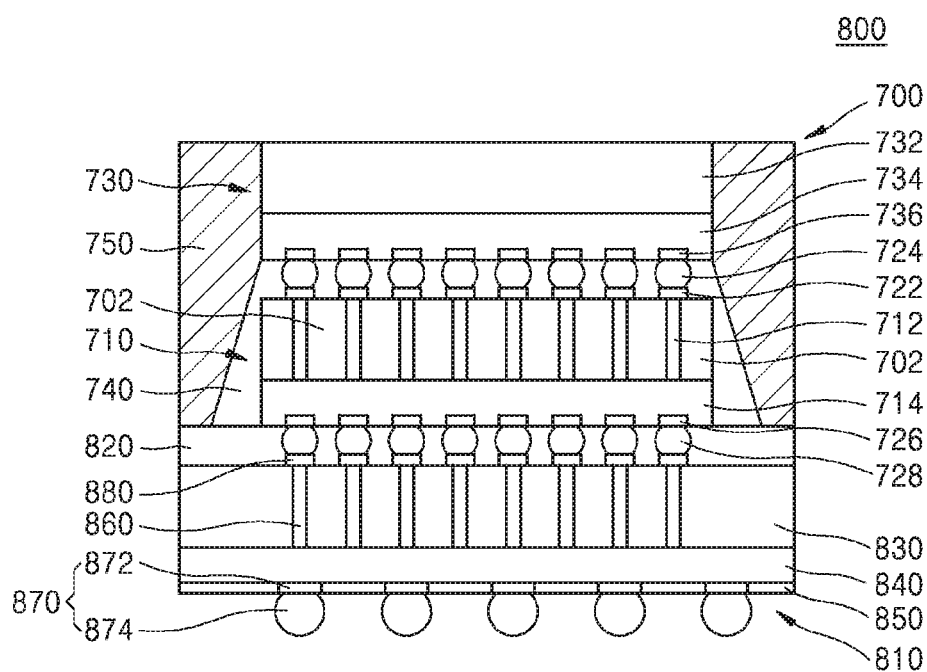
FIG. 19 is a cross-sectional view illustrating a semiconductor package according to an embodiment of the inventive concepts.

FIG. 19 is a cross-sectional view illustrating a semiconductor package 800 according to an embodiment of the inventive concept. In FIG. 19, the same reference numerals as those of FIG. 18 refer to the same elements and detailed descriptions of the elements will not be repeated here.

Referring to FIG. 19, the semiconductor package 800 according to the present embodiment includes a main chip 810 and the semiconductor package 700 mounted on the main chip 810.

The semiconductor package 700 is described in detail with reference to FIG. 18.

The main chip 810 may have a larger horizontal section than those of the first chip 710 and the second chip 730 included in the semiconductor package 700. In some embodiments, the size of the horizontal section of the main chip 810 may be schematically the same as that of the horizontal section of the semiconductor package 700 including the encapsulant 750. The semiconductor package 700 may be mounted on the main chip 810 through an adhesive member 820. Bottom surfaces of the encapsulant 750 and the underfill 740 of the semiconductor package 700 may be adhered to an edge of a top surface of the main chip 810 through the adhesive member 820.

The main chip 810 may include a body layer 830, a lower insulating layer 840, a passivation layer 850, a plurality of TSV units 860 that pass through the body layer 830, a plurality of contact terminals 870, and upper pads 880.

Each of the plurality of TSV units 860 includes the TSV structure 30, the via insulating layer 40, and the metal-containing insulating layer 50 interposed between the conductive barrier layer 34 of the TSV structure 30 and the via insulating layer 40, which are described with reference to FIGS. 1A to 4.

An IC layer and a multilayer wiring pattern may be included in the body layer 830 and the lower insulating layer 840, respectively. The IC layer and the multilayer wiring pattern may be differently formed depending on a kind of the main chip 810. The main chip 810 may form a logic chip such as a central processing unit (CPU), a controller, or an application specific IC (ASIC).

In FIG. 19, it is illustrated that the semiconductor package 700 is laminated on the main chip 810. However, the semiconductor package 700 may be directly mounted on a supporting substrate such as a PCB or a package substrate.

The plurality of contact terminals 870 formed in a lower part of the main chip 810 may include pads 872 and solder balls 874. The contact terminals 870 formed in the main chip 810 may be larger than the contact terminals 728 formed in the semiconductor package 700.

Figure 20:
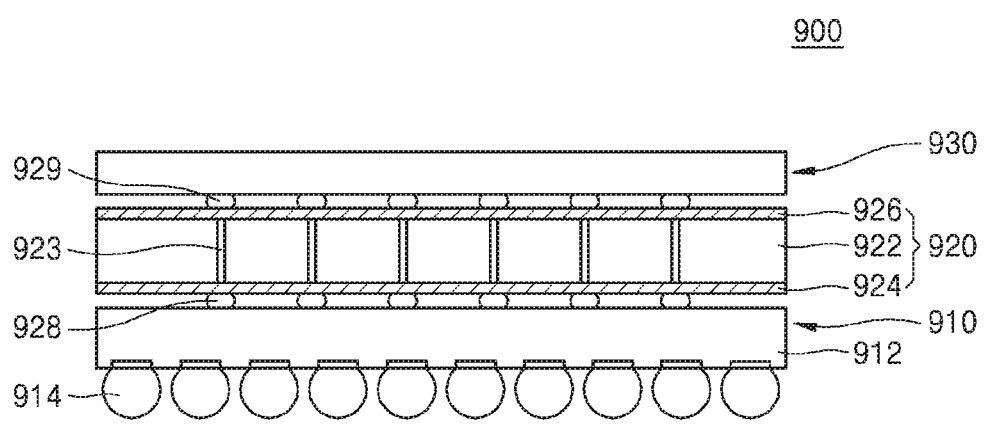
FIG. 20 is a cross-sectional view illustrating a semiconductor package according to an embodiment of the inventive concepts.

FIG. 20 is a cross-sectional view illustrating a semiconductor package 900 according to an embodiment of the inventive concept. In FIG. 20, a semiconductor package 900 formed of a package on package (POP) in which a lower semiconductor package 910 and an upper semiconductor package 930 are flip chip bonded to an interposer 920 that uses the TSV structure is illustrated.

Referring to FIG. 20, the semiconductor package 900 includes the lower semiconductor package 910, the interposer 920 including a plurality of TSV units 923, and the upper semiconductor package 930.

Each of the TSV units 923 includes the TSV structure 30, the via insulating layer 40, and the metal-containing insulating layer 50 interposed between the conductive barrier layer 34 of the TSV structure 30 and the via insulating layer 40, which are described with reference to FIGS. 1A to 4.

A plurality of first contact terminals 914 are adhered to a bottom surface of a substrate 912 of the lower semiconductor package 910. The plurality of first contact terminals 914 may be used for connecting the semiconductor package 900 to a main PCB of an electronic apparatus. In some embodiments, the plurality of first contact terminals 914 may be formed of solder balls or solder lands.

The interposer 920 is used for implementing a vertical connection terminal for connecting the lower semiconductor package 910 and the upper semiconductor package 930 in the form of a fine pitch. A planar size of a POP IC device may be reduced by using the interposer 920. The interposer 920 includes a silicon layer 922 through which the plurality of TSV units 923 pass and rewiring layers 924 and 926 formed on bottom and top surfaces of the silicon layer 922 to rewire the plurality of TSV units 923. In some embodiments, at least one of the rewiring layers 924 and 926 may be omitted.

A plurality of second contact terminals 928 for connecting the plurality of TSV units 923 and the substrate 912 of the lower semiconductor package 910 are formed on a bottom surface of the interposer 920. A plurality of third contact terminals 929 for connecting the plurality of TSV units 923 and the upper semiconductor package 930 are formed on a top surface of the interposer 920. In some embodiments, the second contact terminals 928 and the third contact terminals 929 may be formed of the solder bumps or the solder lands.

When the semiconductor package 900 is a semiconductor device used for a mobile phone, the lower semiconductor package 910 may be a logic device such as a processor and the upper semiconductor package 930 may be a memory device.

In some embodiments, the upper semiconductor package 930 may be a multi-chip package in which a plurality of semiconductor chips (not shown) are laminated and a top surface of the upper semiconductor package 930 may be encapsulated by an encapsulant (not shown) in order to protect the semiconductor chips.

Figure 21:
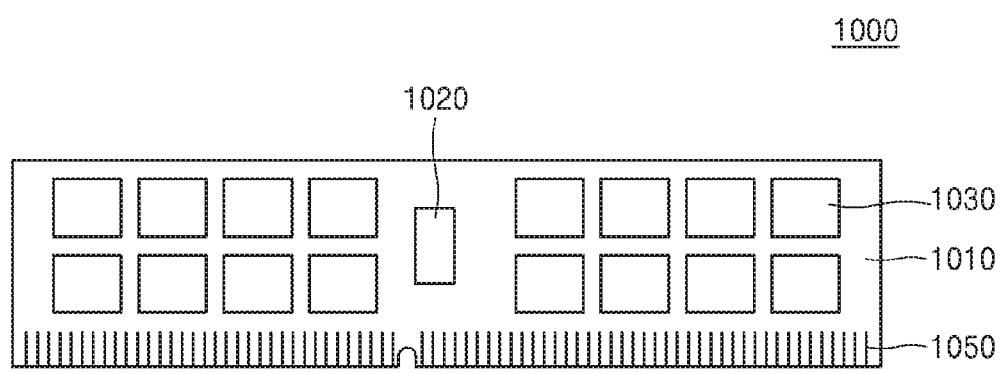
FIG. 21 is a plan view illustrating elements of an IC device according to an embodiment of the inventive concepts.

FIG. 21 is a plan view illustrating elements of an IC device 1000 according to an embodiment of the inventive concept.

An IC device 1000 includes a module substrate 1010 and a control chip 1020 and a plurality of semiconductor packages 1030 mounted on the module substrate 1010. A plurality of input and/or output (I/O) terminals 1050 are formed on the module substrate 1010.

The plurality of semiconductor packages 1030 include at least one of the IC devices 10A, 100A, 1008, and 100C and the semiconductor packages 200, 600, 700, 800, and 900 described with reference to FIGS. 1A to 20.

Figure 22:
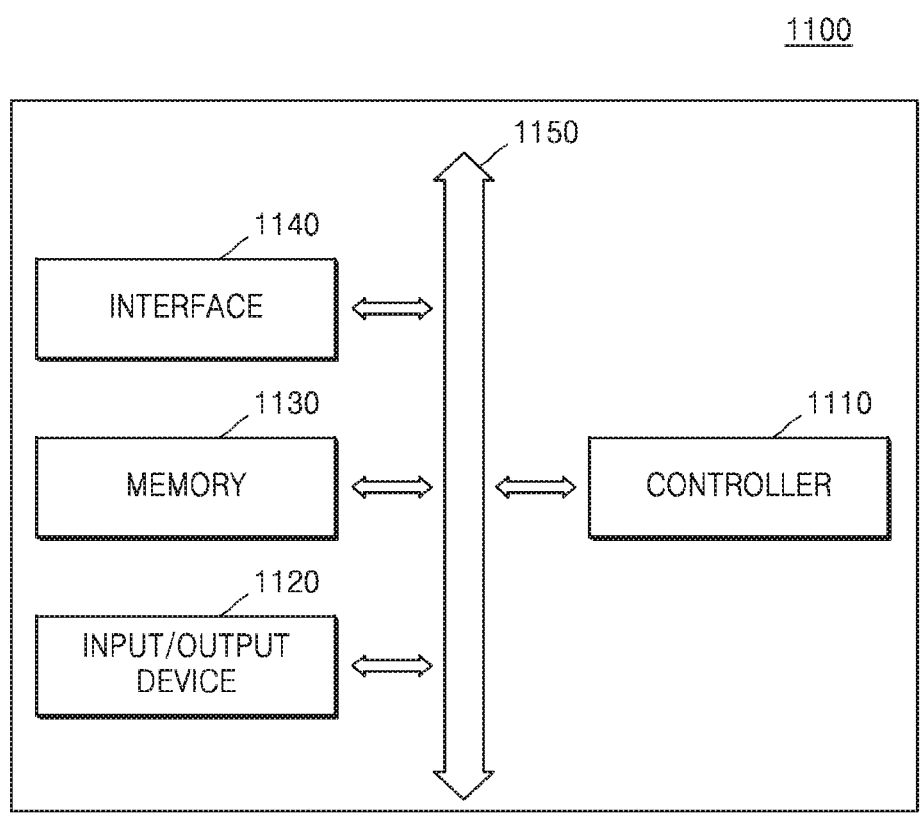
FIG. 22 is a block diagram illustrating elements of an IC device according to an embodiment of the inventive concepts.

FIG. 22 is a block diagram illustrating elements of an IC device 1100 according to an embodiment of the inventive concept.

The IC device 1100 includes a controller 1110, an input and/or output (I/O) device 1120, a memory 1130, and an interface 1140. The IC device 1100 may be a mobile system or a system that transmits or receives information. In some embodiments, the mobile system is at least one of a personal digital assistant (PDA), a portable computer, a web tablet, a wireless phone, a mobile phone, a digital music player, and a memory card.

In some embodiments, the controller 1110 is a microprocessor, a digital signal processor, or a microcontroller.

The input/output device 1120 is used to input/output data to/from the IC device 1100. The IC device 1100 may be connected to an external device such as a personal computer or a network by using the input/output device 1120, and may exchange data with the external device. In some embodiments, the input/output device 1120 is a keypad, a keyboard, or a display device.

In some embodiments, the memory 1130 stores code and/or data for operating the controller 1110. In other embodiments, the memory 1130 stores data processed by the controller 1110. At least one of the controller 1110 and the memory 1130 includes at least one of the IC devices 10A, 100A, 1008, and 100C and the semiconductor packages 200, 600, 700, 800, and 900 described with reference to FIGS. 1A to 20.

The interface 1140 acts as a path through which data is transmitted between the IC device 1100 and another external device. The controller 1110, the input/output device 1120, the memory 1130, and the interface 1140 may communicate with one another via a bus 1150.

The IC device 1100 may be included in a mobile phone, an MP3 player, a navigation system, a portable multimedia player (PMP), a solid-state disc (SSD), and household appliances.

While the inventive concept has been particularly shown and described with reference to exemplary embodiments thereof, it will be understood that various changes in form and details may be made therein without departing from the spirit and scope of the following claims.

We claim:

1. A method of forming a semiconductor device including a through-silicon via (TSV), the method comprising:
forming a via hole that extends through at least a part of a semiconductor substrate;
forming a via insulating layer that covers an inner wall of the via hole within the via hole;
degassing the via insulating layer;
forming a conductive barrier layer on the via insulating layer within the via hole,
wherein the degassing of the via insulating layer and the forming of the conductive barrier layer are performed in situ and in a vacuum atmosphere;
filling the via hole with a conductive structure; and
after the filling of the via hole with the conductive structure, forming an oxidized outer portion of the conductive barrier layer between the via insulating layer and the conductive barrier layer by heat treating the conductive barrier layer and the via insulating layer.

2. The method of claim 1, wherein the degassing of the via insulating layer and the forming of the conductive barrier layer are performed in a physical vapor deposition (PVD) chamber.

3. The method of claim 1, wherein the forming of the oxidized outer portion of the conductive barrier layer comprises oxidizing an outer portion of the conductive barrier layer, wherein the oxidized outer portion of the conductive barrier layer substantially surrounds a remaining portion of the conductive barrier layer.

4. The method of claim 3, wherein the oxidized outer portion of the conductive barrier layer has a thickness of not more than about 50 angstroms.

5. The method of claim 3, wherein a thickness of the remaining portion of the conductive barrier layer ranges from about 10 angstroms to about 100 angstroms.

6. The method of claim 1, further comprising forming a seed layer before filling the via hole with the conductive structure, wherein forming a seed layer is performed in situ and in a vacuum atmosphere.

7. The method of claim 1, wherein degassing is performed under a pressure of about $10^{-3}$ Torr to $10^{-4}$ Torr for about 30 seconds to about 5 minutes.

8. The method of claim 1, wherein the semiconductor device is a logic device, and wherein degassing is performed at a temperature range of about 350° C. to about 400° C.

9. The method of claim 8, wherein degassing is performed at about 375° C.

10. The method of claim 1, wherein the semiconductor device is a memory device, and wherein degassing is performed at a temperature range of about 375° C. to about 500° C.

11. The method of claim 1, wherein an aspect ratio of the via hole is between about 5 and about 20.

12. A method comprising:
forming an opening that extends through at least a part of a semiconductor substrate, wherein the opening has an aspect ratio between about 5 to about 20;
forming an insulating layer that covers an inner wall of the opening within the opening;
degassing the insulating layer at a temperature range of between approximately 300° C. and approximately 500° C.;
forming a conductive barrier layer on the insulating layer within the opening,
wherein the degassing of the insulating layer and the forming of the conductive barrier layer are performed in situ and in a vacuum atmosphere;
filling the opening with a conductive structure; and
after the filling of the opening with the conductive structure, forming an oxidized outer portion of the conductive barrier layer between the insulating layer and the conductive barrier layer by heat treating the conductive barrier layer and the insulating layer such that an outer portion of the conductive barrier is oxidized,
wherein the oxidized outer portion of the conductive barrier layer substantially surrounds a remaining portion of the conductive barrier layer during the heat treating.

13. An assembly method comprising:
forming a via hole that extends through at least a part of a semiconductor substrate having a transistor;
forming a via insulating layer that covers an inner wall of the via hole within the via hole;
degassing the via insulating layer at a temperature range of between approximately 300° C. and approximately 500° C.;

forming a conductive barrier layer on the via insulating layer within the via hole, wherein the degassing of the via insulating layer and the forming of the conductive barrier layer are performed in situ and in a vacuum atmosphere;

filling the via hole with a conductive structure, thereby forming a TSV;

after the filling of the via hole with the conductive structure, forming an oxidized outer portion of the conductive barrier layer between the via insulating layer and the conductive barrier layer by heat treating the conductive barrier layer and the via insulating layer by oxidizing an outer portion of the conductive barrier, wherein the oxidized outer portion of the conductive barrier layer substantially surrounds a remaining portion of the conductive barrier layer during the heat treating; and stacking the semiconductor substrate with another semiconductor substrate having another TSV formed therethrough, wherein the TSV is electrically coupled to another TSV.

14. The method of claim 12, wherein the degassing of the insulating layer and the forming of the conductive barrier layer are performed in a physical vapor deposition (PVD) chamber.

15. The method of claim 12, wherein the oxidized outer portion of the conductive barrier layer has a thickness of not more than about 50 angstroms.

16. The method of claim 12, further comprising forming a seed layer before filling the opening with the conductive structure, wherein forming a seed layer is performed in situ and in a vacuum atmosphere.

17. The method of claim 13, wherein the degassing of the via insulating layer and the forming of the conductive barrier layer are performed in a physical vapor deposition (PVD) chamber.

18. The method of claim 13, wherein the oxidized outer portion of the conductive barrier layer has a thickness of not more than about 50 angstroms.

19. The method of claim 13, wherein a thickness of the remaining portion of the conductive barrier layer ranges from about 10 angstroms to about 100 angstroms.

20. The method of claim 13, wherein an aspect ratio of the via hole is between about 5 and about 20.

* * * * *